(12) United States Patent
Tanaka et al.

(10) Patent No.: US 7,663,146 B2
(45) Date of Patent: Feb. 16, 2010

(54) ACTIVE MATRIX ADDRESSING LIQUID-CRYSTAL DISPLAY DEVICE

(75) Inventors: Hiroaki Tanaka, Tokyo (JP); Akira Fujita, Tokyo (JP); Shigeru Kimura, Tokyo (JP); Akitoshi Maeda, Tokyo (JP); Takasuke Hayase, Izumi (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 1245 days.

(21) Appl. No.: 10/028,778

(22) Filed: Dec. 28, 2001

(65) Prior Publication Data

US 2002/0085157 A1 Jul. 4, 2002

(51) Int. Cl.
*G02F 1/1343* (2006.01)

(52) U.S. Cl. .................. 257/72; 247/59; 247/E29.147; 349/147

(58) Field of Classification Search ................. 349/147, 349/38, 42, 43, 47, 139, 46; 257/59, 72, 257/410, 66, E29.147, E29.151
See application file for complete search history.

(56) References Cited

U.S. PATENT DOCUMENTS

| | | | | | |
|---|---|---|---|---|---|
| 3,883,314 | A | * | 5/1975 | Schnyder et al. | 75/231 |
| 4,591,418 | A | * | 5/1986 | Snyder | 204/192.16 |
| 5,008,217 | A | * | 4/1991 | Case et al. | 438/681 |
| 5,071,693 | A | * | 12/1991 | Sue et al. | 428/212 |
| 5,909,635 | A | * | 6/1999 | Marieb et al. | 438/625 |
| 5,995,177 | A | * | 11/1999 | Fujikawa et al. | 349/46 |
| 6,096,572 | A | * | 8/2000 | Nakamura | 438/30 |
| 6,226,059 | B1 | * | 5/2001 | Yamamoto et al. | 349/42 |
| 6,249,325 | B1 | * | 6/2001 | Ohkawara et al. | 349/38 |
| 6,277,674 | B1 | * | 8/2001 | Wang et al. | 438/132 |
| 6,414,738 | B1 | * | 7/2002 | Fujikawa | 349/147 |

(Continued)

FOREIGN PATENT DOCUMENTS

JP 5-190551 7/1993

(Continued)

OTHER PUBLICATIONS www.en.wikipedia.org/wiki/Titanium_nitride, May 2008.*

*Primary Examiner*—Thomas L Dickey
*Assistant Examiner*—Fazli Erdem
(74) *Attorney, Agent, or Firm*—Young & Thompson

(57) ABSTRACT

An active matrix addressing LCD device having an active matrix substrate on which conductive lines are formed is provided, which suppress the Al hillock without complicating the structure of the lines and which decreases the electrical connection resistance increase at the terminals of the lines, thereby improving the connection reliability. The device comprises an active matrix substrate having a transparent, dielectric plate, thin-film transistors (TFTs) arranged on the plate, and pixel electrodes arranged on the plate. Gate electrodes of the TFTs and scan lines have a first multilevel conductive structure. Common electrodes and common lines may have the first multilevel conductive structure. Source and drain electrodes of the TFTs and signal lines may have a second multilevel conductive structures. Each of the first and second multilevel conductive structures includes a three-level TiN/Ti/Al or TiN/Al/Ti structure or a four-level TiN/Ti/Al/Ti structure. Each of the TiN film of the first and second structures has a nitrogen concentration of 25 atomic % or higher. The Al file may be replaced with an Al alloy.

7 Claims, 25 Drawing Sheets

U.S. PATENT DOCUMENTS

| | | | |
|---|---|---|---|
| 6,433,842 B1 * | 8/2002 | Kaneko et al. | 439/43 |
| 6,448,578 B1 * | 9/2002 | Shimada et al. | 257/59 |
| 6,461,899 B1 * | 10/2002 | Kitakado et al. | 438/149 |
| 6,489,632 B1 * | 12/2002 | Yamazaki et al. | 257/66 |
| 6,504,585 B2 * | 1/2003 | Ohkawara et al. | 349/38 |
| 6,529,251 B2 * | 3/2003 | Hibino et al. | 349/42 |
| 6,583,471 B1 * | 6/2003 | Yamazaki et al. | 257/350 |
| 6,589,822 B1 * | 7/2003 | Yamazaki et al. | 438/151 |
| 6,632,696 B2 * | 10/2003 | Kimura et al. | 438/30 |
| 6,661,476 B1 * | 12/2003 | Abe et al. | 349/38 |
| 2003/0057419 A1 * | 3/2003 | Murakami et al. | 257/72 |

FOREIGN PATENT DOCUMENTS

| | | |
|---|---|---|
| KR | 2000-22736 | 4/2000 |
| KR | 2000-62586 | 10/2000 |

* cited by examiner

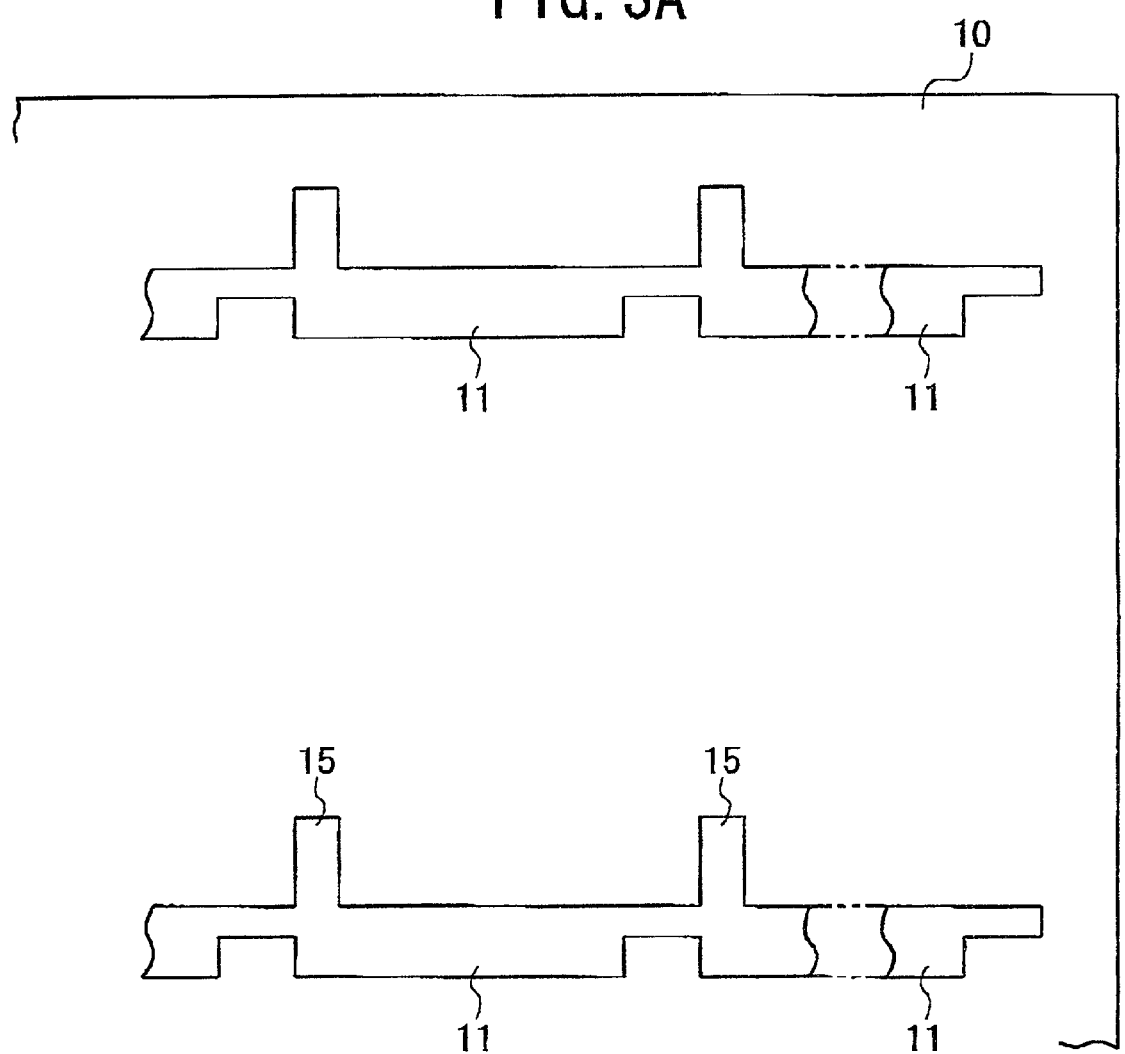

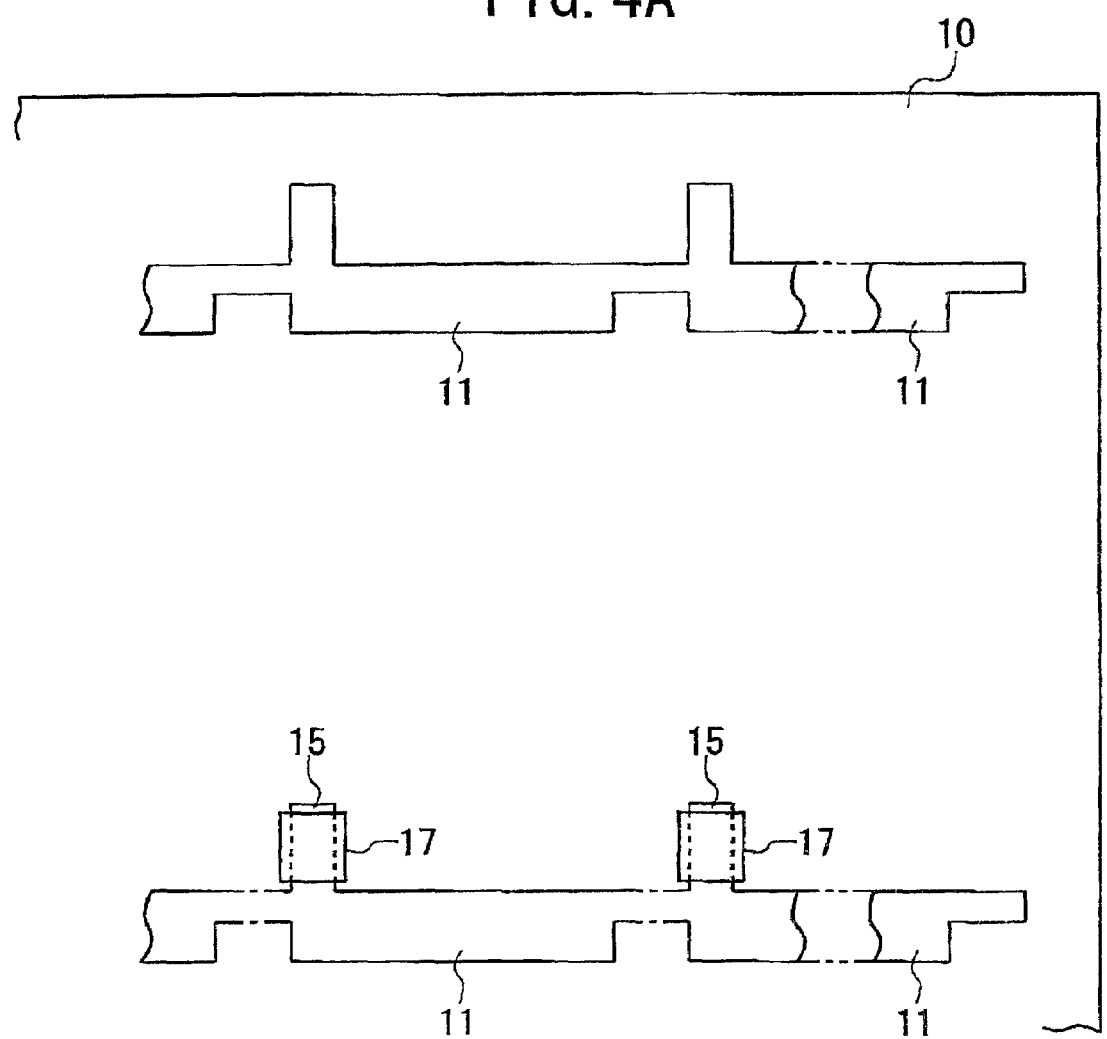

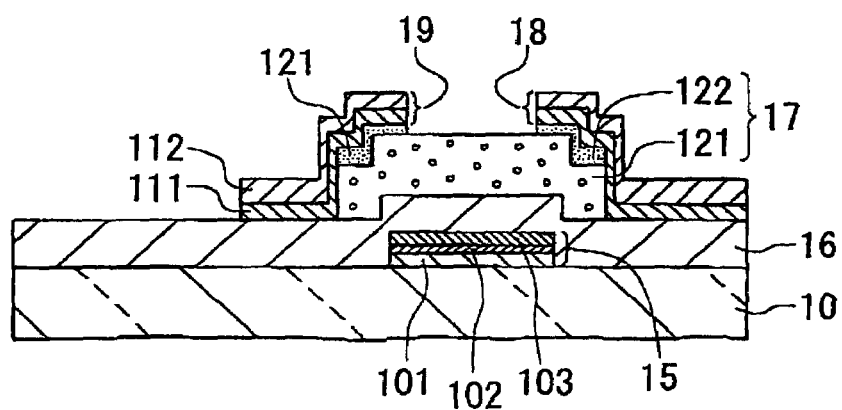
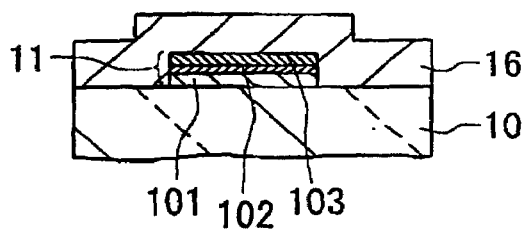 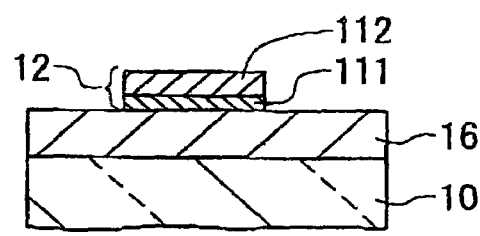

FIG. 7

| No. | MULTILEVEL STRUCTURE (THICKNESS UNIT:nm) | HEAT TREATMENT | Al HILLOCK NUMBER (pieces/mm$^2$) |
|---|---|---|---|
| 1 | TiN(100)/Al(200) | N$_2$ ATMOSPHERE 300°C, 1Hr | 6410 |
| 2 | TiN(50)/Ti(50)/Al(200) | | 26 |
| 3 | TiN(100)/Ti(50)/Al(200) | | ~4 |
| 4 | TiN(100)/Ti(100)/Al(200) | | ~1 |
| 5 | TiN(50)/Al(200)/Ti(30) | | 0 |
| 6 | TiN(100)/Al(200)/Ti(30) | | 0 |

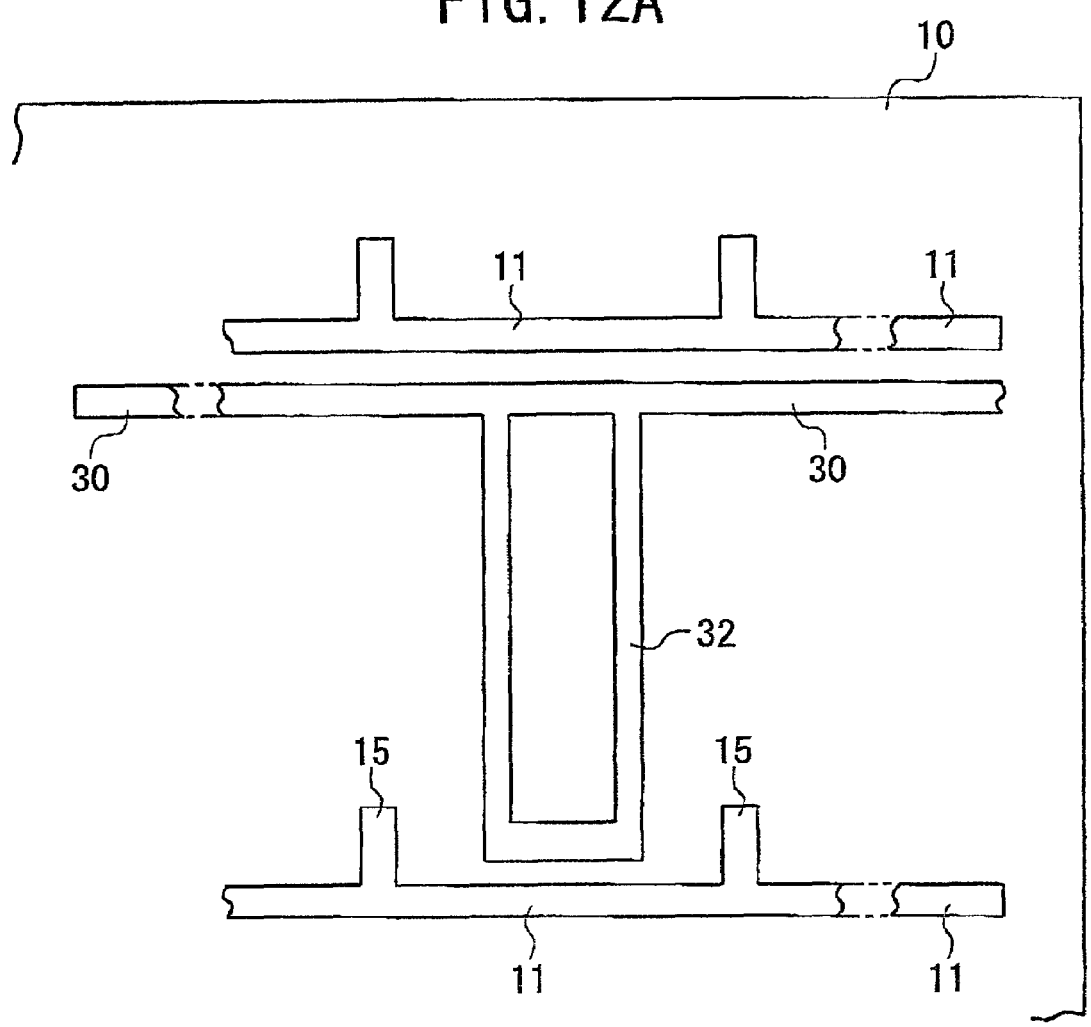

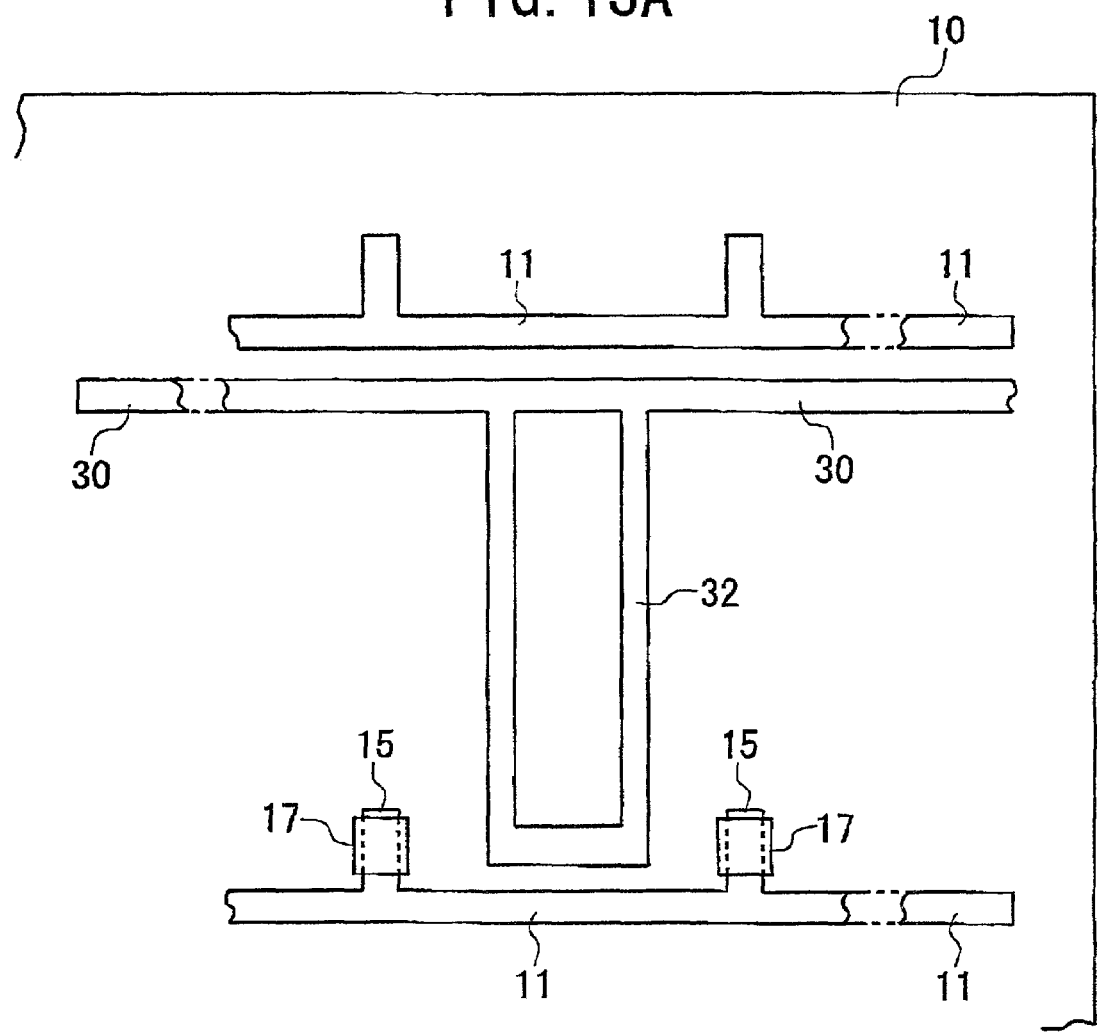

ACTIVE MATRIX ADDRESSING LIQUID-CRYSTAL DISPLAY DEVICE

BACKGROUND OF THE INVENTION

1. Field of the Invention

The present invention relates to an active-matrix addressing Liquid-Crystal Display (LCD) device having a so-called active-matrix substrate on which pixel electrodes and Thin-Film Transistors (TFTs) are arranged in a matrix array.

More particularly, the invention relates to an active-matrix addressing LCD device with an active-matrix substrate on which multilayer-structured conductive lines are formed along with pixel electrodes and TFTs, which suppresses effectively aluminum (Al) hillocks without any complicated conductive line structure to thereby decreasing the connection resistance increase of the lines due to heat or moisture and improving their connection reliability.

2. Description of the Related Art

The active-matrix addressing LCD device has a typical configuration as follows.

The LCD device of this type comprises an active matrix substrate and an opposite substrate coupled to each other in parallel to form a specific gap between them with a sealing member. The gap between the substrates forms a closed space for confining a specific liquid crystal. Thus, the space (and the liquid crystal) is sandwiched by the substrates.

Pixel areas are arranged in a matrix array on the active matrix substrate. TFTs are arranged on the active matrix substrate to correspond to the respective pixel areas, which are to control the voltages applied to the corresponding pixel electrodes. Opposing electrodes are arranged on the opposite substrate. Specific voltages are applied across the electrodes arranged on these two substrates to drive the liquid crystal, thereby displaying images on the screen of the LCD device.

If the LCD device is of the vertical electric-field type where electric fields are generated to be approximately vertical to the substrates in the closed space (i.e., in the liquid crystal) on operation, the active matrix substrate comprises a transparent glass plate. Scan lines extending in the first direction are arranged at equal intervals on the surface of the glass plate in the second direction, where the second direction is perpendicular to the first direction. Signal lines extending in the second direction are arranged at equal intervals on the surface of the glass plate in the first direction. The pixel electrodes are arranged at the respective pixel areas defined by the scan lines and the signal lines thus intersected. The TFTs are arranged in the respective pixel areas, The gate electrodes, the drain electrodes, and the source electrodes of the TFTs are connected to the scan lines, the signal lines, and the pixel electrodes, respectively.

Accordingly, when specific electric currents are supplied to one of the scan lines and one of the signal lines, respectively, the TFT located at the intersection of these scan and signal lines are turned on, allowing a specific voltage to be applied to the relating pixel electrode to the TFT in question. This operation is conducted for all the necessary pixels. Thus, a desired image is displayed on the screen of the device Each of the scan lines has a scan-line terminal at its end. Each of the signal lines has a signal-line terminal at its end. These scan- and signal-line terminals are used to connect a tape-shaped cable for interconnecting the scan and signal lines with a specific driver circuit unit. The cable includes a set of conductive or wiring lines previously connected to the driver circuit unit. Thus, the scan and signal lines are connected to the unit by way of the corresponding lines of the cable.

With the active-matrix substrate of this type, there is the need to decrease the size of the pixel electrodes and to decrease the electrical resistance of the scan and signal lines themselves by using any other conductive material of lower electrical resistance and any other structure. This is responsive to the recent requirement of enlarging the LCD device and of raising the density of the elements or components used in the device.

Moreover, since the scan and signal lines need to be connected to the conductive lines of the tape-shaped flat cable at their terminals, these terminals need to be made of a reliable material or materials to prevent the connection reliability at the terminals from degrading due to invasion of moisture.

To meet the above-described need, various improvements have been made and disclosed so far.

For example, the Japanese Non-Examined Patent Publication No. 7-120789, which was published in 1995, discloses a multi-level conductive structure applicable to the scan and signal lines of the LCD device This structure includes a lower aluminum (Al) film and an upper titanium nitride (TiN) film. The Al film is used to lower the electrical resistance of the structure or the lines. The TiN film is used to prevent the underlying Al film from being exposed to various chemicals during the fabrication processes and therefore, corrosion of the TiN firm can be avoided. This means that a highly reliable connection structure is possible.

However, the multi-level conductive structure disclosed by the Publication No. 7-120789 has a problem that hillocks tend to occur on the Al film. As known well, "Al hillocks" are small hills or protrusions formed on the surface of the Al films which are caused by the fact that a compressive stress is applied to the Al film in a heat treatment process and then, the stress is relaxed or decreased with time to thereby diffuse the Al atoms of the film outwardly. The Al hillocks will cause various defects (e.g., inter-level short-circuit) and as a result, the fabrication yield degradation will be more likely.

A technique to prevent the Al hillocks is disclosed by, for example, the Japanese Non-Examined Patent Publication No. 7-58110 published in 1995. This technique includes a multi-level conductive structure with TiN, Ti, Al, TiON, and Ti films. In other words, this technique includes a TiN/Ti/Al/TiON/Ti structure. The top-level TiN film is used to prevent reflection of light and to ensure desired etch selectivity in the contact-hole formation process. The upper Ti film is to decrease the electrical connection resistance. The middle-level Al film is used as a conductor material. The TiON film is used as a diffusion barrier film against silicon (Si) The bottom-level or lower Ti film is to decrease the electrical connection resistance.

With the technique disclosed by the Publication No. 7-58110, the Al film is sandwiched by the top-level TiN film and the underlying TiON film to prevent the Al hillocks (and alloy pits). However, the Publication No. 7-58110 discloses only the TiN/Ti/Al/TiON/Ti structure and fails to disclose other conductive or wiring structures that are effective to prevent the Al hillocks. Therefore, it is not clear that whether or not the TiN/Ti/Al/TiON/Ti structure disclosed therein is effective or advantageous to the case where the conductive or wiring structure is not contacted with a semiconductor layer. For example, if the disclosed structure is applied to the gate electrodes of the TFTs of the LCD device described above, the gate electrodes are not contacted with a semiconductor layer but a dielectric glass plate. In this case, it is not clear whether or not the disclosed structure is effective or advantageous.

In particular, the TiON film of the disclosed structure, which is used as the diffusion barrier film against Si, is unnecessary for the LCD device, because the gate electrodes are not contacted with a semiconductor layer. The TiON film only makes the structure complicated.

Furthermore, according to the information disclosed by the Publication No. 7-58110, it is seen that the combination of the TiN film and the Ti film located above the Al film and the combination of the TiON film and the Ti film located below the Al film are effective to the cases disclosed therein. However, it is not clear whether or not the disclosed advantages in the Publication No. 7-58110 are expected as well even if some of the constituent films of the TiN/Ti/Al/TiON/Ti structure is/are cancelled.

SUMMARY OF THE INVENTION

Accordingly, an object of the present invention is to provide an active matrix addressing LCD device with an active matrix substrate on which specific conductive lines are arranged along with pixel electrodes and TFTs, in which the Al hillock is effectively suppressed without complicating the line structure and at the same time, the electrical connection resistance increase at the terminals of the lines is decreased to thereby improve the connection reliability.

Another object of the present invention is to provide an active matrix addressing LCD device with an active matrix substrate on which specific conductive lines are arranged along with pixel electrodes and TFTs, in which the size of the pixel electrodes can be decreased.

Still another object of the present invention is to provide an active matrix addressing LCD device with an active matrix substrate on which specific conductive lines are arranged along with pixel electrodes and TFTs, in which the LCD device can be enlarged and the density of the elements used in the device can be raised.

The above objects together with others not specifically mentioned will become clear to those skilled in the art from the following description.

According to a first aspect of the invention, an active matrix addressing LCD device is provided. This device comprises:

an active matrix substrate having a transparent, dielectric plate, TFTs arranged on the plate, and pixel electrodes arranged on the plate;

gate electrodes of the TFTs having a first multilevel conductive structure;

scan lines connected to the corresponding gate electrodes and having the first multilevel conductive structure;

the first multilevel conductive structure including a TiN film located at a top of the structure, an Al-based film located below the TiN film, and at least one Ti film located at at least one of an upper position and a lower position with respect to the Al-based film; and the TiN film of the first multilevel conductive structure having a nitrogen concentration of 25 atomic % or higher.

In a preferred embodiment of the device of the first aspect, the device further comprises:

common electrodes formed on the plate to be opposite to the corresponding pixel electrodes; and common lines formed on the plate to be connected to the corresponding common electrodes;

the common electrodes and the common lines having a second multilevel conductive structure;

the second multilevel conductive structure including a TiN film located at a top of the structure, an Al-based film located below the TiN film, and at least one Ti film located at at least one of an upper position and a lower position with respect to the Al-based film; and the TiN film of the second multilevel conductive structure having a nitrogen concentration of 25 atomic % or higher.

In another preferred embodiment of the device of the first aspect, each of the scan lines has a terminal at its end for electrical connection to an external circuit The TiN film is exposed from the first multilevel conductive structure at the terminal.

In still another preferred embodiment of the device of the first aspect, each of the common lines has a terminal at its end for electrical connection to an external circuit. The TiN film is exposed from the second multilevel conductive structure at the terminal.

According to a second aspect of the invention, another active matrix addressing LCD device is provided. This device comprises:

an active matrix substrate having a transparent, dielectric plate, TFTs arranged on the plate, and pixel electrodes arranged on the plate;

source electrodes of the TFTs having a first multilevel conductive structure;

drain electrodes of the TFTs having the first multilevel conductive structure;

signal lines connected to the corresponding source electrodes and having the first multilevel conductive structure;

the first multilevel conductive structure including a TiN film located at a top of the structure, an Al-based film located below the TiN film, and at least one Ti film located at at least one of an upper position and a lower position with respect to the Al-based film; and the TiN film of the first multilevel conductive structure having a nitrogen concentration of 25 atomic % or higher.

In a preferred embodiment of the device of the second aspect, the pixel electrodes have the first multilevel conductive structure.

In another preferred embodiment of the device of the second aspect, each of the signal lines has a terminal at its end for electrical connection to an external circuit. The TiN film is exposed from the first multilevel conductive structure at the terminal.

According to a third aspect of the invention, still another active matrix addressing LCD device is provided. This device comprises:

an active matrix substrate having a transparent, dielectric plate, TFTs arranged on the plate, and pixel electrodes arranged on the plate;

gate electrodes of the TFTs having a first multilevel conductive structure;

scan lines connected to the corresponding gate electrodes and having the first multilevel conductive structure;

the first multilevel conductive structure including a TiN film located at a top of the structure, an Al-based film located below the TiN film, and at least one Ti film located at at least one of an upper position and a lower position with respect to the Al-based film; and the TiN film of the first multilevel conductive structure having a nitrogen concentration of 25 atomic % or higher;

source electrodes of the TFTs having a second multilevel conductive structure;

drain electrodes of the TFTs having the second multilevel conductive structure;

signal lines connected to the corresponding source electrodes and having the second multilevel conductive structure;

the second multilevel conductive structure including a TiN film located at a top of the structure, an Al-based film located below the TiN film, and at least one Ti film located at an upper position or both an upper position and a lower position with respect to the Al-based film; and the TiN film of the second multilevel conductive structure having a nitrogen concentration of 25 atomic % or higher.

In a preferred embodiment of the device of the third aspect, common electrodes formed on the plate to be opposite to the corresponding pixel electrodes and common lines formed on the plate to be connected to the corresponding common electrodes are additionally provided The common electrodes and the common lines have the first multilevel conductive structure.

In another preferred embodiment of the device of the third aspect, the pixel electrodes have the first multilevel conductive structure.

In still another preferred embodiment of the device of the third aspect, each of the scan lines has a terminal at its end for electrical connection to an external circuit. The TiN film is exposed from the first multilevel conductive structure at the terminal.

In a further preferred embodiment of the device of the third aspect, each of the common lines has a terminal at its end for electrical connection to an external circuit. The TiN film is exposed from the second multilevel conductive structure at the terminal.

According to a fourth aspect of the invention, a further active matrix addressing LCD device is provided. This device comprises:

an active matrix substrate having a transparent, dielectric plate, TFTs arranged on the plate, and pixel electrodes arranged on the plate;

gate electrodes of the TFTs having a first multilevel conductive structure;

scan lines connected to the corresponding gate electrodes and having the first multilevel conductive structure;

the first multilevel conductive structure including a TiN film located at a top of the structure, an Al-based film located below the TiN film, and at least one Ti film located at at least one of an upper position and a lower position with respect to the Al-based film; and the TiN film of the first multilevel conductive structure having a nitrogen concentration of 25 atomic % or higher;

source electrodes of the TFTs having a second multilevel conductive structure;

drain electrodes of the TFTs having the second multilevel conductive structure;

signal lines connected to the corresponding source electrodes and having the second multilevel conductive structure;

the second multilevel conductive structure including a TiN film located at a top of the structure, an Al-based film located below the TiN film, and at least one Ti film located at an upper position or both an upper position and a lower position with respect to the Al-based film; and the TiN film of the second multilevel conductive structure having a nitrogen concentration of 25 atomic % or higher In a preferred embodiment of the device of the fourth aspect, common electrodes formed on the plate to be opposite to the corresponding pixel electrodes and common lines formed on the plate to be connected to the corresponding common electrodes are additionally provided. The common electrodes and the common lines have the first multilevel conductive structure.

In another preferred embodiment of the device of the fourth aspect, the pixel electrodes have the second multilevel conductive structure.

In still another preferred embodiment of the device of the fourth aspect, each of the scan lines has a terminal at its end for electrical connection to an external circuit. The TiN film is exposed from the first multilevel conductive structure at the terminal.

In a further preferred embodiment of the device of the fourth aspect, each of the signal lines has a terminal at its end for electrical connection to an external circuit. The TiN film is exposed from the second multilevel conductive structure at the terminal.

In a still further preferred embodiment of the device of the fourth aspect, each of the common lines has a terminal at its end for electrical connection to an external circuit. The TiN film is exposed from the first multilevel conductive structure at the terminal.

In the devices of the first to fourth aspects of the invention, preferably, for example, each of the first and second multilevel conductive structures is a three-level structure of TiN/Ti/Al or TiN/Al/Ti. Alternately, it is preferred that each of the first and second multilevel conductive structures is a four-level structure of TiN/Ti/Al/Ti.

As the Al-based film, not only a substantially pure Al film but also an Al alloy film may be used.

With the active matrix addressing LCD devices according to the first to fourth aspects of the invention, since the Ti film is contacted with the Al-based film in each of the first and second multilevel conductive structures, generation of Al hillocks on the Al-based film is effectively suppressed.

For the drain electrode, the Ti film is located below the Al-based film in the second multilevel conductive structure and therefore, the Ti film is located between the Al-based film and an underlying semiconductor island. Thus, generation of alloy pits is suppressed for the drain electrode.

Moreover, since the TIN film is located at the top of the first or second multilevel conductive structure, corrosion at the terminals of the scan, signal, and common lines is prevented. Thus, the electrical connection resistance increase at the terminals of these lines can be decreased, thereby enhancing or improving the connection reliability at the same terminals.

BRIEF DESCRIPTION OF THE DRAWINGS

In order that the present invention may be readily carried into effect, it will now be described with reference to the accompanying drawings.

FIG. 3A is a schematic, partial, enlarged plan view showing the process step of a method of fabricating the substrate of the device according to the first embodiment of FIG. 1.

FIG. 4A is a schematic, partial, enlarged plan view showing the process step of the method of fabricating the substrate of the device according to the first embodiment of FIG. 1, which is subsequent to the step of FIG. 3A.

FIGS. 5B to 5D are schematic, partial, enlarged cross-sectional views along the lines IIB-IIB, IIC-IIC, and IID-IID in FIG. 2A, respectively, which show the process step of FIG. 5A.

FIG. 7 is a table showing the correlation of the number of induced Al hillocks with the multilevel conductive structures used in the first and third embodiments and the prior-art of the Publication No 7-120789.

FIG. 12A is a schematic, partial, enlarged plan view showing the process step of a method of fabricating the substrate of the device according to the second embodiment of FIG. 10.

FIGS. 12B to 12M are schematic, partial, enlarged cross-sectional views along the lines XIB-XIB, XIC-XIC, XID-XID, and XIE-XIE in FIG. 11A, respectively, which show the process step of FIG. 12A.

FIG. 13A is a schematic, partial, enlarged plan view showing the process step of the method of fabricating the substrate of the device according to the second embodiment of FIG. 10, which is subsequent to the step of FIG. 12A.

DETAILED DESCRIPTION OF THE PREFERRED EMBODIMENTS

Figure 1:
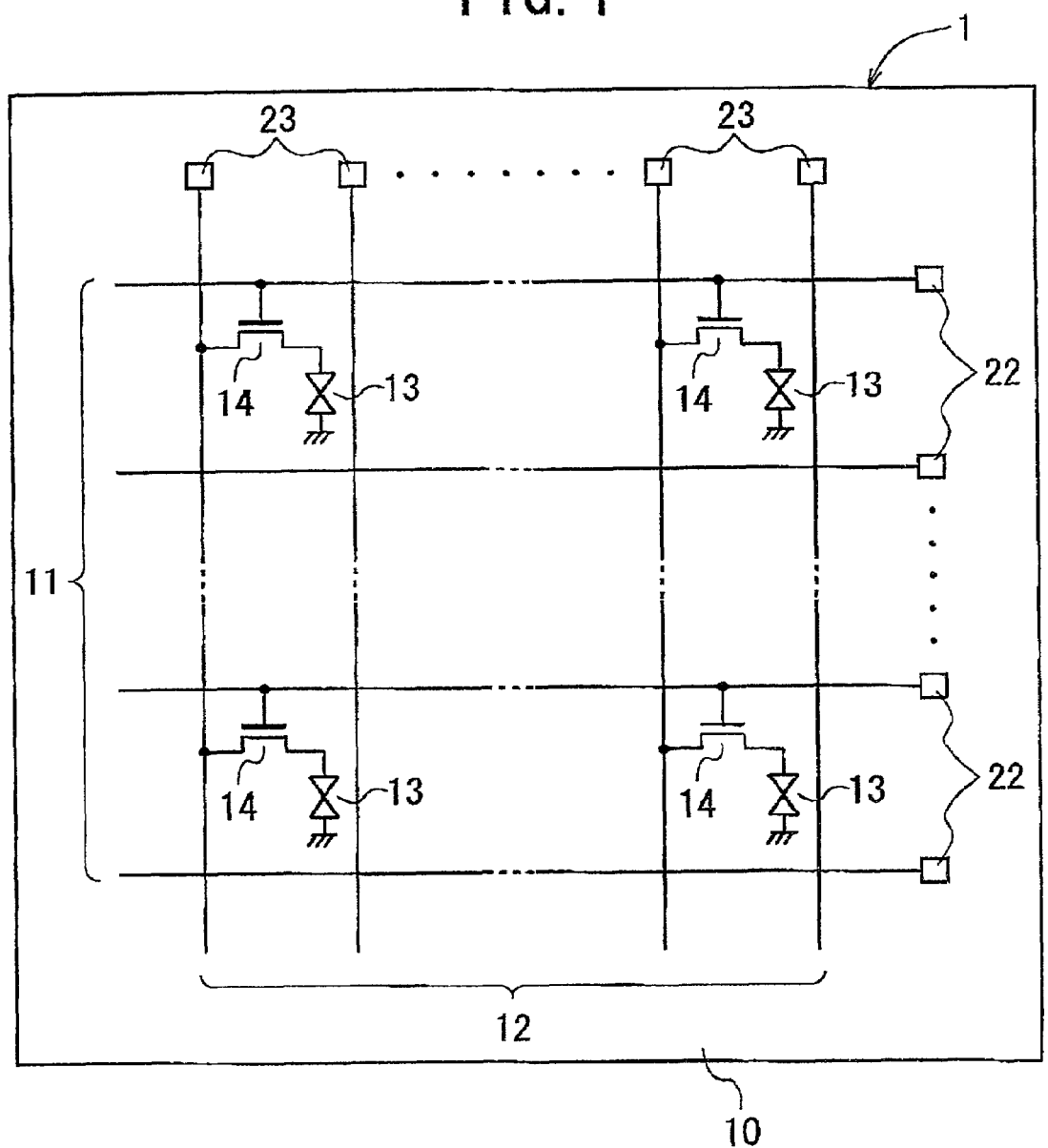
FIG. 1 is a schematic plan view showing the configuration of an active matrix substrate of an active matrix addressing LCD device according to a first embodiment of the invention.

Preferred embodiments of the present invention will be described in detail below while referring to the drawings attached.

First Embodiment

An active matrix addressing LCD device according to a first embodiment of the invention is shown in FIG. 1 and FIGS. 2A to 2D. This device is of the vertical electric-field type.

As shown in FIG. 1, the LCD device according to the first embodiment comprises an active matrix substrate 1 and an opposite substrate (not shown) coupled to each other in parallel to form a specific gap between them with a sealing member (not shown). The gap between the substrates forms a closed space in which a specific liquid crystal is confined. This configuration itself is known well and therefore, no further explanation is presented here.

Since the feature of the invention resides in the active matrix substrate 1, the following explanation will be mainly made with respect to the substrate 1. The substrate 1 has the following configuration.

As shown in FIG. 1, the active matrix substrate 1 comprises a transparent glass plate 10. Scan lines 11 extending in the first direction (in the horizontal direction in FIG. 1) are arranged at equal intervals on the surface of the plate 10 in the second direction (in the vertical direction in FIG. 1) perpendicular to the first direction.

Signal lines 12 extending in the second direction are arranged at equal intervals on the surface of the plate 10 in the first direction Thus, the scan lines 11 intersect perpendicularly with the signal lines 12.

Pixel areas 13 are formed in the rectangular areas formed on the surface of the plate 10 by the respective scan and signal lines 11 and 12. Thus, the areas 13 are arranged in a matrix array on the surface of the plate 11.

TFTs 14 are arranged on the surface of the plate 11 which are located in the respective pixel areas 13. The TFTs 14, which are of the inverted-staggered type, are used to control the voltages applied to the corresponding areas 13.

Figure 2A:
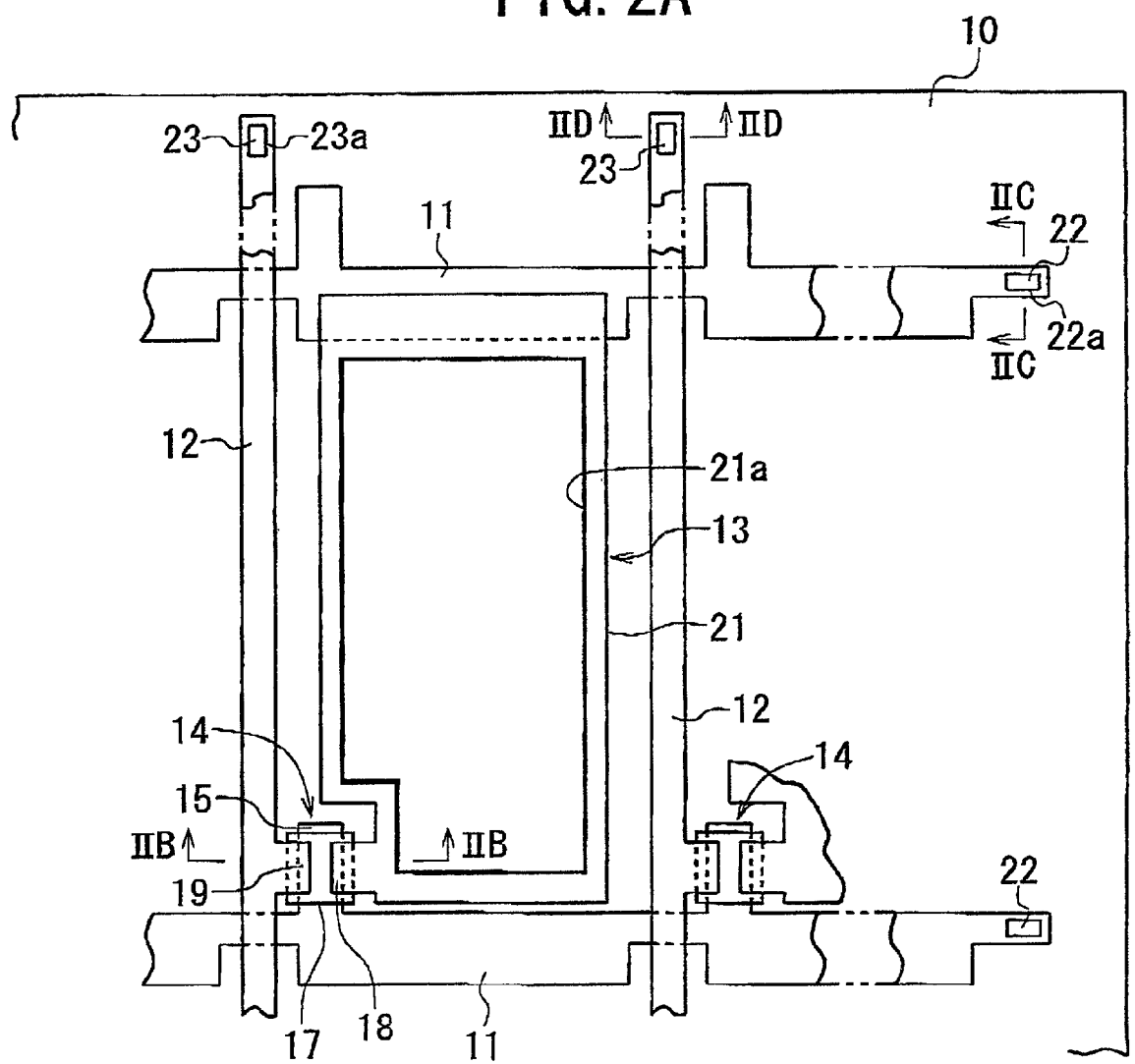
FIG. 2A is a schematic, partial, enlarged plan view showing the layout of the pixel area and its neighborhood of the substrate of the device according to the first embodiment of FIG. 1.
Figure 2B:
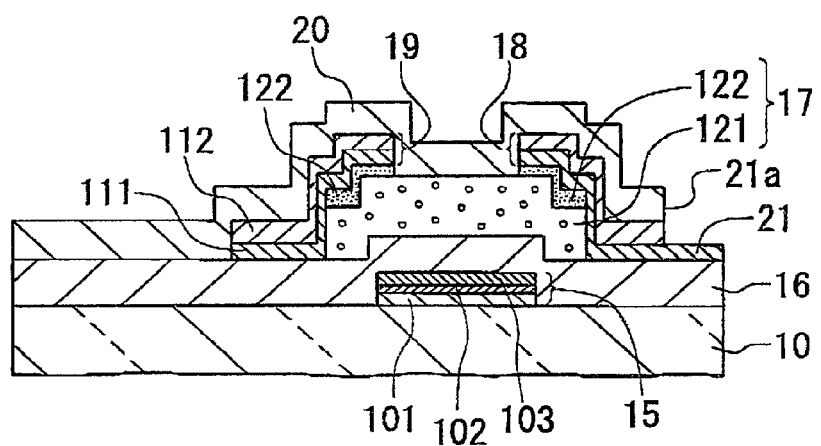
FIG. 2B is a schematic, partial, enlarged cross-sectional view along the line IIB-IIB in FIG. 2A.
Figure 2C:
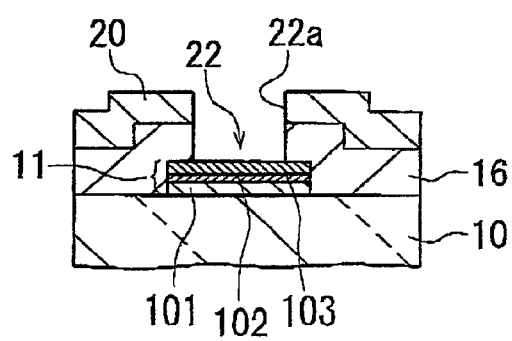
FIG. 2C is a schematic, partial, enlarged cross-sectional view along the line IIC-IIC in FIG. 2A.
Figure 2D:
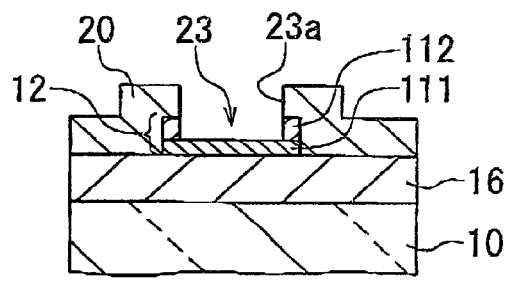
FIG. 2D is a schematic, partial, enlarged cross-sectional view along the line IID-IID in FIG. 2A.
Figure 3B:
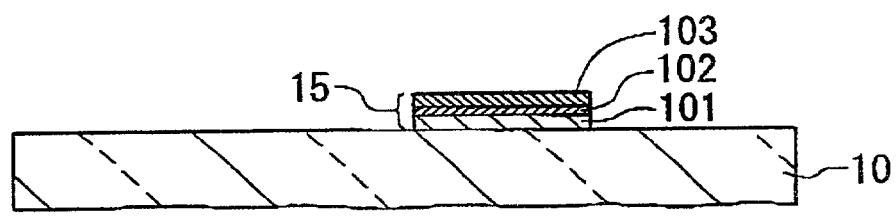
FIGS. 3B to 3D are schematic, partial, enlarged cross-sectional views along the lines IIB-IIB, IIC-IIC, and IID-IID in FIG. 2A, respectively, which show the process step of FIG. 3A.
Figure 3C:
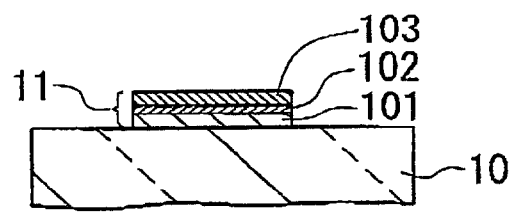
Figure 3D:
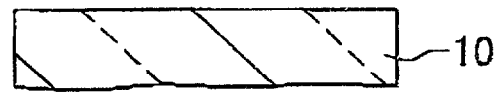
Figure 4B:
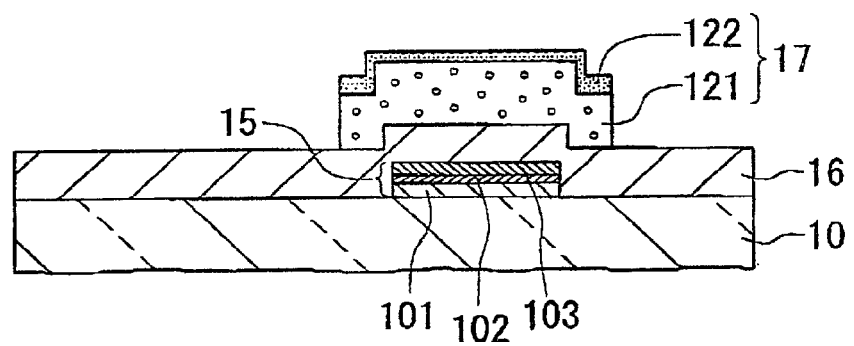
FIGS. 4B to 4D are schematic, partial, enlarged cross-sectional views along the lines IIB-IIB, IIC-IIC, and IID-IID in FIG. 2A, respectively, which show the process step of FIG. 4A.
Figure 4C:
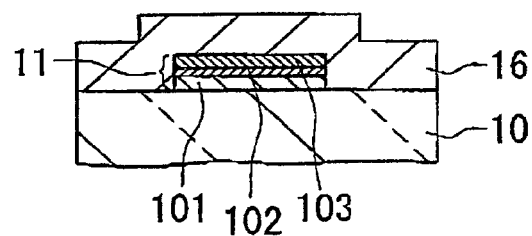
Figure 4D:
Figure 5A:
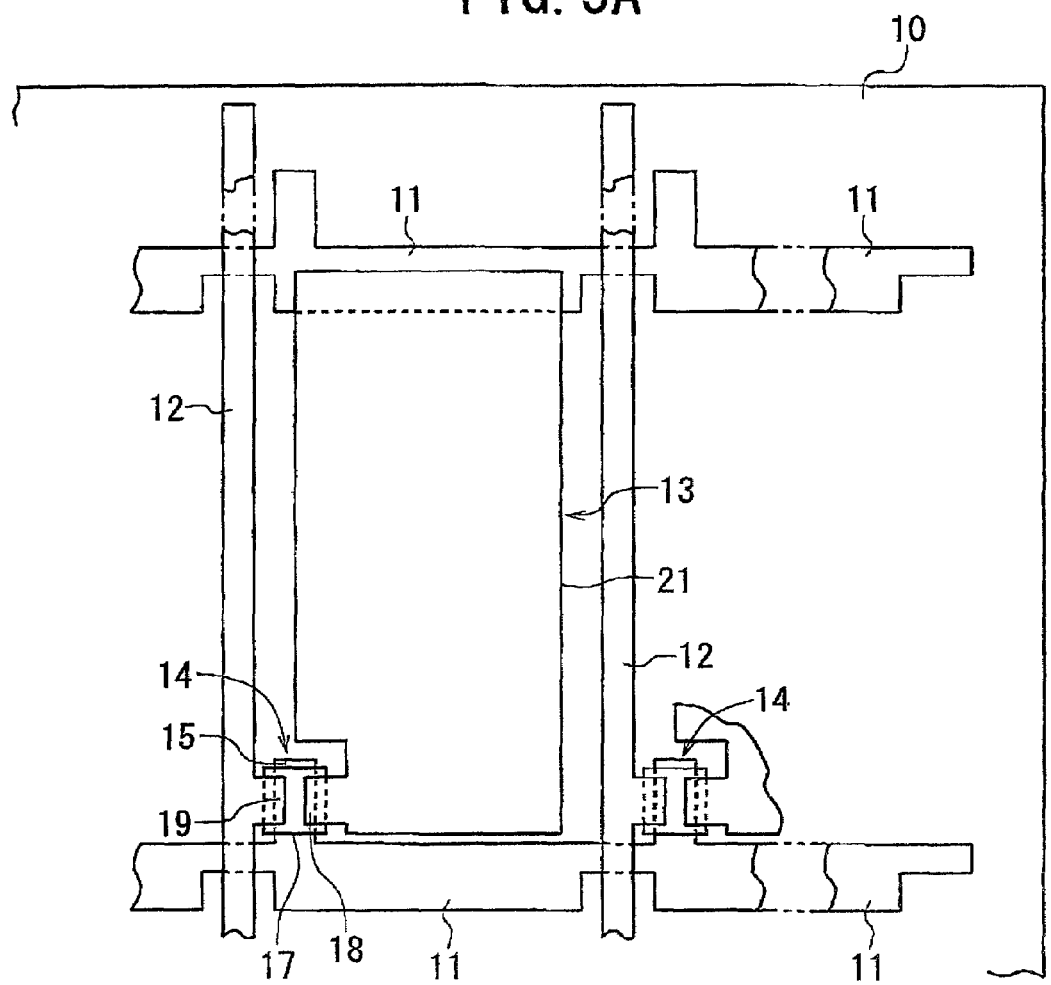
FIG. 5A is a schematic, partial, enlarged plan view showing the process step of the method of fabricating the substrate of the device according to the first embodiment of FIG. 1, which is subsequent to the step of FIG. 4A.
Figure 6A:
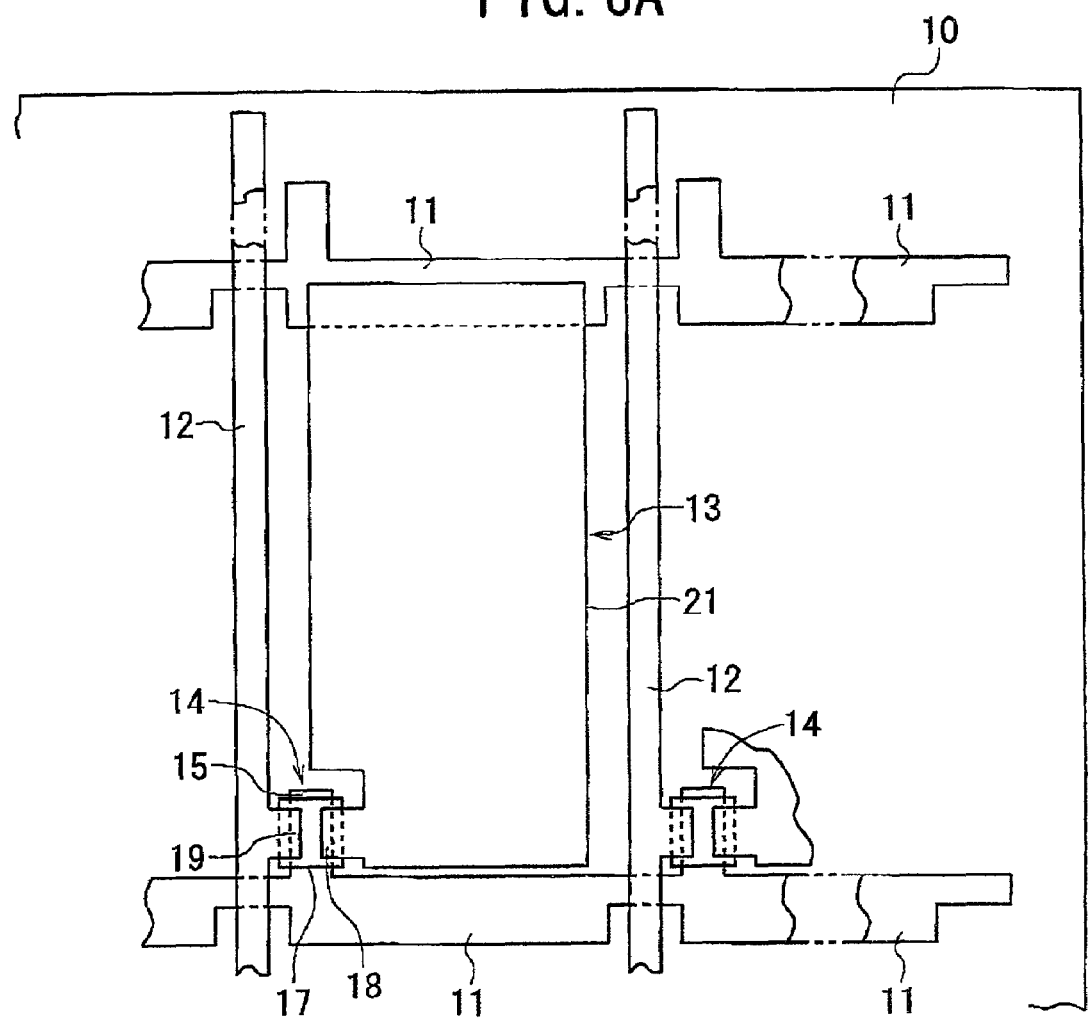
FIG. 6A is a schematic, partial, enlarged plan view showing the process step of the method of fabricating the substrate of the device according to the first embodiment of FIG. 1, which is subsequent to the step of FIG. 5A.
Figure 6B:
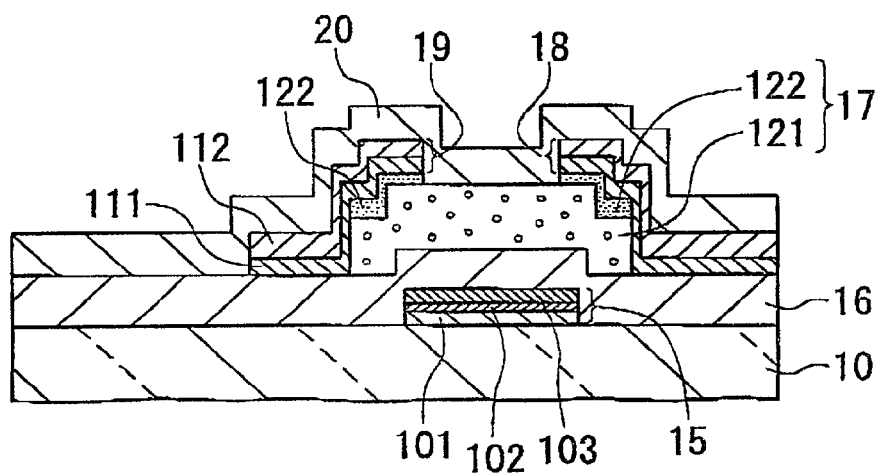
FIGS. 6B to 6D are schematic, partial, enlarged cross-sectional views along the lines IIB-IIB, IIC-IIC, and IID-IID in FIG. 2A, respectively, which show the process step of FIG. 6A.
Figure 6C:
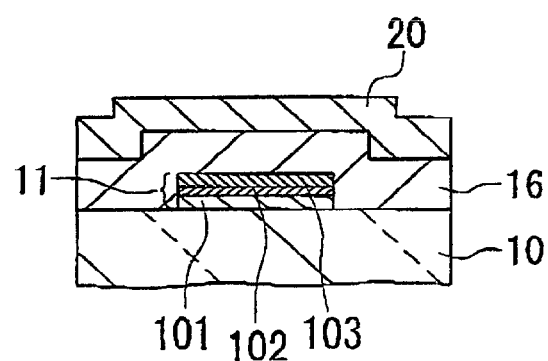
Figure 6D:
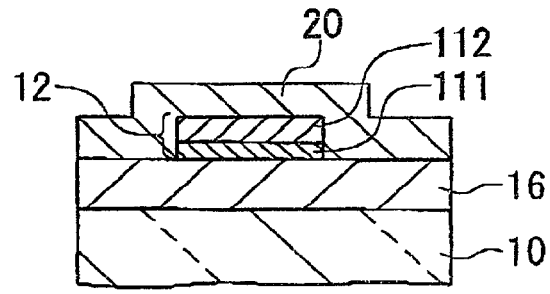

As clearly shown in FIG. 2B, each of the TFTs 14 has a gate electrode 15, a gate insulating film 16, an island-shaped semiconductor layer (i.e., a semiconductor island) 17, a source electrode 18, and a drain electrode 19. The gate electrode 15 is located on the same level as the scan lines 11 on the surface of the glass plate 10. The gate insulating film 16 is formed on the surface of the plate 10 to cover the scan lines 11 and the gate electrode 15. The semiconductor island 17 is formed on the gate insulating film 16 to be opposite to the gate electrode 15 by way of the film 16. The source electrode 18 and the drain electrode 19 are formed on the same level as the signal lines 12 on the surface of the plate 10. The source electrode 18 is located on one side of the island 17 and the drain electrode 19 is located on the other side thereof. A passivation film 20 is formed to cover the TFTs 14.

The gate insulating film 16 and the passivation film 20 are commonly used by all the TFTs 14.

Each of the pixel areas 13 comprises a transparent pixel electrode 21 made of a transparent conductive material, such as ITO (Indium Tin Oxide). Most of the electrode 21 is exposed through a corresponding opening (i.e., display window) 21a of the passivation film 20. The exposed part of the electrode 21 serves as part of the display area.

The gate electrode 15 is connected to a corresponding one of the scan lines 11. The drain electrode 19 is connected to a corresponding one of the signal lines 12. The source electrode 19 is connected to a corresponding one of the pixel electrodes 21.

Each of the scan lines 11 has a connection terminal 22 at its end, as shown in FIGS. 1 and 2A. The connection terminal 22 of the line 11 is exposed from the gate insulating film 16 and the passivation film 20 through a corresponding opening 22a, as clearly shown in FIG. 2C. Similarly, each of the signal lines 12 has a connection terminal 23 at its end, as shown in FIGS. 1 and 2A. The connection terminal 23 of the line 12 is exposed from the gate insulating film 16 and the passivation film 20 through a corresponding opening 23a, as clearly shown in FIG. 2D.

The gate electrodes 15 and the scan lines 11 are formed by the same multilevel conductive film. In other words, they are formed by a common conductive film with a multilevel structure. Specifically, as seen from FIGS. 2B and 2C, the common conductive film is formed by an Al film (thickness: 100 nm) 101 located at the bottom, a Ti film (thickness: 50 nm) 102 located at the middle, and a TiN film (thickness: 200 nm) 103 located at the top Therefore, it is said that the common conductive film has the three-level TiN/Ti/Al structure.

The source and drain electrodes 18 and 19 and the signal lines 12 are formed by the same multilevel conductive film. In other words, they are formed by a common conductive film with a multilevel structure. Specifically, as seen from FIGS. 2B and 2D, the common conductive film is formed by an ITO film (thickness: 50 nm) 111 located at the bottom, and a Cr (chromium) film (thickness: 200 nm) 112 located at the top. Therefore, it is said that the common conductive film has the two-level Cr/ITO structure.

Next, a method of fabricating the active matrix substrate 1 of the first embodiment is explained below with reference to FIGS. 3A to 3D, 4A to 4D, 5A to 5D, and 6A to 6D.

First, as shown in FIGS. 3A to 3D, the Al film 101 with a thickness of 200 nm, the Ti film 102 with a thickness of 50 nm, and the TiN film 103 with a thickness of 100 nm are successively formed on the surface of the glass plate 10 by a sputtering method. Thus, the three-level TiN/Ti/Al structure is formed.

Then, the first photolithography process is carried out for the three-level TiN/Ti/Al structure thus formed. Specifically, a first photoresist film (not shown) is formed on the structure and then, exposed to specific light and developed, thereby patterning the first photoresist film. Thereafter, using the patterned first photoresist film as a mask, the TiN/Ti/Al structure is patterned by a dry etching method, thereby forming the gate electrodes 15 and the scan lines 11 on the surface of the plate 10. The state at this stage is shown in FIGS. 3A to 3D.

The TiN film 103 is formed by a reactive sputtering method in such a way that the nitrogen concentration of the film 103 is 25 atomic % or higher while controlling the flow rate ratio of Ar and $N_2$ gases. This is easily realized under the condition that the pressure in the sputtering chamber is 0.8 Pa, the flow rate of Ar gas is 225 sccm, the flow rate of $N_2$ gas is 150 sccm, the DC discharge power is 16 kW, the substrate temperature is 150° C., and the sputtering gap is 115 mm, for example.

Thereafter, as shown in FIGS. 4A to 4D, a SiN (silicon nitride) film with a thickness of 400 nm is formed over the whole surface of the plate 10 as the gate insulating film 16. The SiN film 16 covers entirely the patterned TiN/Ti/Al structure. An intrinsic amorphous silicon (i-type a-Si) film 121 with a thickness of 250 nm is formed on the SiN film 16 and then, an $n^+$-type a-Si film 122 with a thickness of 50 nm is formed on the i-type a-Si film 121. The film 122 is doped with phosphorus (P) as a n-type impurity. The $n^+$-type a-Si film 122, which serves as an ohmic layer, is used to ensure ohmic contact with the drain and source electrodes 18 and 19. These two films 121 and 122 are formed by a plasma-enhanced CVD (Chemical Vapor Deposition) method.

Next, the second photolithography process is carried out in the following way. A second photoresist film (not shown) is formed on the $n^+$-type a-Si film 122 and then, exposed to specific light and developed, thereby patterning the second photoresist film. Thereafter, using the patterned second photoresist film as a mask, the a-Si films 121 and 122 are successively patterned by a dry etching method, thereby forming the semiconductor islands 17 on the gate insulating film (i.e., the SiN film) 16 to be opposite to the corresponding gate electrodes 15. The state at this stage is shown in FIGS. 4A to 4D.

Subsequently, the ITO film 111 with a thickness of 50 nm, which is transparent, is formed on the $n^+$-type a-Si film 122 over the whole surface of the glass plate 10 and then, the Cr film 112 with a thickness of 200 nm is formed on the film 111. These two films 111 and 112 are deposited by a sputtering method.

Next, the third photolithography process is carried out in the following way. A third photoresist film (not shown) is formed on the Cr film 112 and then, exposed to specific light and developed, thereby patterning the third photoresist film. Thereafter, using the patterned third photoresist film as a mask, the Cr film 112 and the ITO film 111 are successively patterned by a wet etching method. Thus, the pixel electrodes 21, the source electrodes 18 united with the corresponding pixel electrodes 21, the drain electrodes 19, and the signal lines 12 united with the corresponding drain electrodes 19 are formed.

Using the source and drain electrodes 18 and 19 as a mask, the underlying $n^+$-type a-Si film 122 is selectively removed by a dry etching method. Thus, "channel gaps" are formed between the corresponding pairs of the electrodes 18 and 19. The remaining film 122 forms the ohmic layer located just below the electrodes 18 and 19. As a result, the TFTs 14 are formed to be arranged in a matrix array on the surface of the plate 10. The state at this stage is shown in FIGS. 5A to 5D.

Subsequently, a SiN film, which serves as the passivation film 20, is formed to cover the TFTs 14, the scan and signal lines 11 and 12, and the pixel areas 13 over the entire surface of the plate 10 by a plasma-enhanced CVD method. Then, the fourth photolithography process is carried out in the following way. A fourth photoresist film (not shown) is formed on the SiN film 20 and then, exposed to specific light and developed, there by pattering the fourth photoresist film. Thereafter, using the patterned fourth photoresist film as a mask, the SiN film 20 is patterned by an etching method. Thus, the film 20 is selectively removed at the pixel electrodes 21, the terminals 22 of the scan lines 11, and the terminals 23 of the signal lines 12. Moreover, the gate insulating film 16 also is selectively removed at the terminals 22 while the Cr film 112 is selectively removed at the terminals 23 and the pixel areas 13. In this way, the windows or openings 21a, 22a, and 23a are formed.

As a result, as shown in FIGS. 2A to 2D, the scan lines 11 are exposed from the passivation film 20 and the gate insulating film 16 by way of the openings 22a at the scan-line terminals 22. The signal lines 12 (i.e., their ITO film 111) are exposed from the passivation film 20 and the Cr film 112 by way of the openings 23a at the signal-line terminals 23. The pixel areas 13 (i.e., their ITO film 111) are exposed from the passivation film 20 and the Cr film 112 by way of the openings 21a.

Furthermore, although not illustrated here, an alignment layer is formed on the passivation film 20. Thus, the active matrix substrate 1 according to the first embodiment is completed.

On the other hand, an opposite substrate (not shown) is placed to be opposed to the active matrix substrate 1 at a specific gap and then, these two substrates are coupled together with a sealing member so as to confine a liquid crystal in the gap. Thus, the LCD panel is completed.

Thereafter, one end of a flat cable of a driver circuit unit is connected to the scan and signal lines 11 and 12 at their terminals 22 and 23. Thus, the conductive lines combined in the cable are connected to the respective scan and signal lines 11 and 12, resulting in electrical interconnection of the driver circuit unit with the LCD panel. This makes it possible to supply electric power to the LCD panel and to drive all the pixels on the active matrix substrate 1, thereby displaying images on the screen of the device. In this way, the active matrix addressing LCD device of the first embodiment is finally fabricated.

With the LCD device according to the first embodiment, the active matrix substrate 1 employs the three-level TiN/Ti/Al structure to form the gate electrodes 15 and the scan lines 11. Therefore, the effect to suppress Al hillocks is enhanced or raised without complicating the structure of the lines 11, compared with the prior-art TiN/Al structure of the of the Publication No. 7-120789.

Moreover, since the TiN film 103 has a nitrogen concentration of 25 atomic % or higher, the increase of the electrical connection resistance at the terminals 22 of the scan lines 11 is suppressed. This improves the connection reliability at the terminals 22.

FIG. 7 shows the correlation of the number of induced Al hillocks with the three-level TiN/Ti/Al structure used in the first embodiment of the invention and the two-level TiN/Al structure used in the prior-art wiring structure disclosed by the Publication No. 7-120789. The data shown in FIG. 7 were obtained by the inventors' test conducted in the following way.

After the inventive TiN/Ti/Al structure and the prior-art TiN/Al structure were formed, they were subjected to a heat treatment process at 300° C. for one hour in a nitrogen atmosphere. Thereafter, the inventors observed Al hillocks induced on the Al films of the inventive and prior-art structures and then, they counted the total number of the hillocks existing in the square area of 1 mm×1 mm of the Al films with the naked eye.

In the prior-art TiN/Al structure (Sample No. 1 in FIG. 7) of the Publication No. 7-120789, the total number of the Al hillocks was 6410 pieces/mm². On the other hand, in the inventive TiN/Ti/Al structure (Sample No. 3 in FIG. 7) of the first embodiment, the total number of the Al hillocks was limited to approximately 4 pieces/mm² Thus, it was seen that the inventive structure of the first embodiment is much fewer in the Al hillock number than the prior-art structure. This means that Al hillocks can be effectively suppressed at the terminals 22 of the scan lines 11 without making their structure complicated.

The sample Nos. 2 and 4 shown in FIG. 7 are variations of the inventive TiN/Ti/Al structure of the first embodiment. The sample No. 2, which has the TiN film thickness of 50 nm, the Ti film thickness of 50 nm, and the Al film thickness of 200 nm, has an Al hillock number of 26 pieces/mm². The sample No. 4, which has the TiN film thickness of 100 nm, the Ti film thickness of 100 nm, and the Al film thickness of 200 nm, has an Al hillock number of approximately 1 piece/mm².

It is seen from the sample Nos. 2 and 4 that the inventive structure of the first embodiment is much fewer in the Al hillock number than the prior-art structure, even if the constituent film thickness is changed.

The inventors presumed that the advantage of the inventive structure of the first embodiment was generated by the placement that the Ti film 102 was located between the TiN and Al films 103 and 101, in other words, the effect of the TiN film 103 to physically suppress the hillocks was enhanced by the TiN/Ti/Al placement. Moreover, it is seen from the sample Nos. 2 and 4 that the hillock suppressing effect can be enhanced if the thickness of the TiN film 103 is increased. It is seen from the sample Nos. 2 and 4 that the hillock suppressing effect can be enhanced if the thickness of the Ti film 102 is increased as well.

With the inventive TiN/Ti/Al structure of the first embodiment, the TiN film 103 located at the top improves the reliability of electrical interconnection at the scan-line terminals 22. This is shown in FIG. 8 and FIGS. 9A to 9C.

Figure 8:
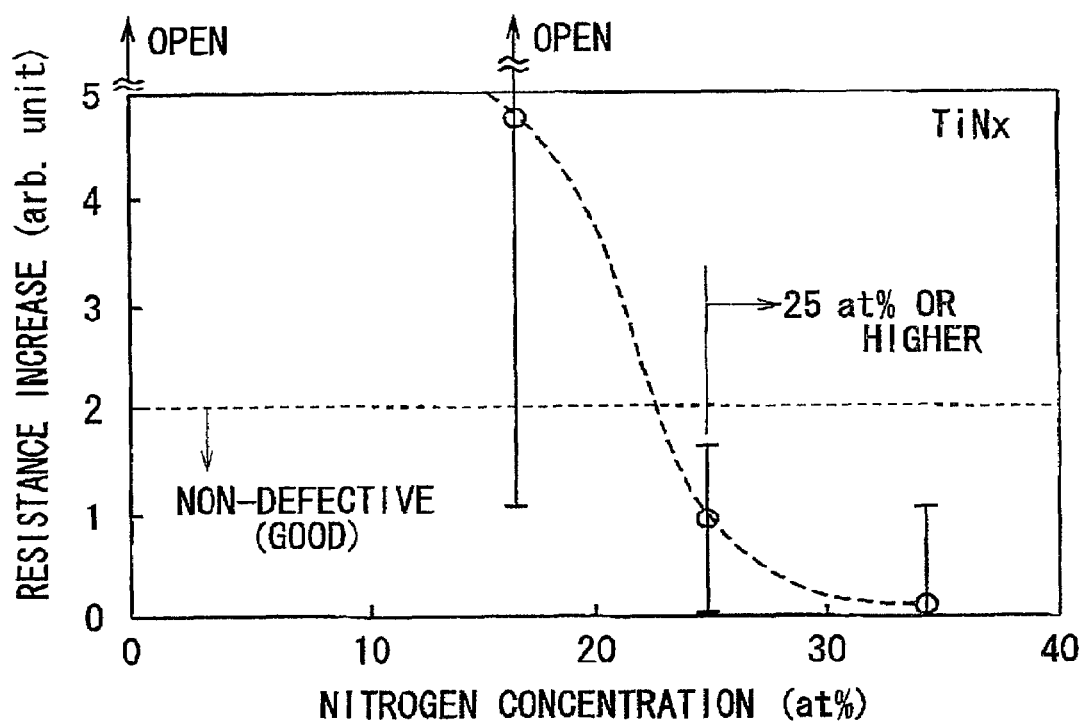
FIG. 8 is a graph showing the correlation of the nitrogen concentration of the TiN film with the electrical resistance increase of the multilevel conductive structures used in the first and third embodiments and the Prior-art of the Publication No. 7-120789.

FIG. 8 shows the correlation of the nitrogen concentration of the TiN film 103 with the electrical resistance increase of the TiN/Ti/Al and TiN/Al structures used in the first embodiment and the prior-art. The data in FIG. 8 was obtained by the following test conducted by the inventors.

Figure 9A:
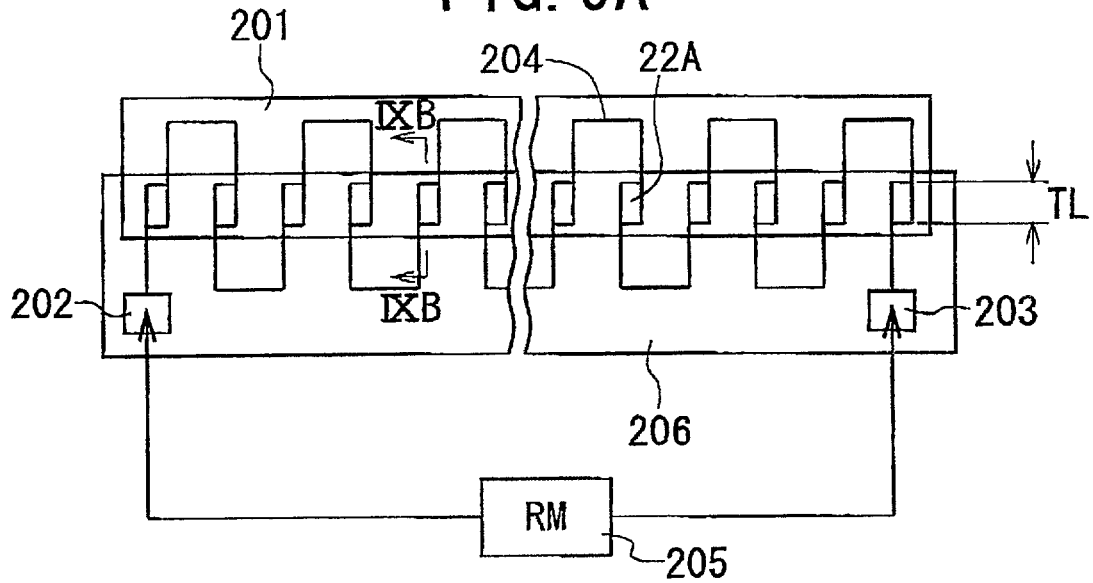
FIG. 9A is a schematic plan view showing the method of testing the electrical connection resistance at the dummy terminals of the dummy scan lines, which is used for the invention and the prior art of the Publication No. 7-120789.
Figure 9B:
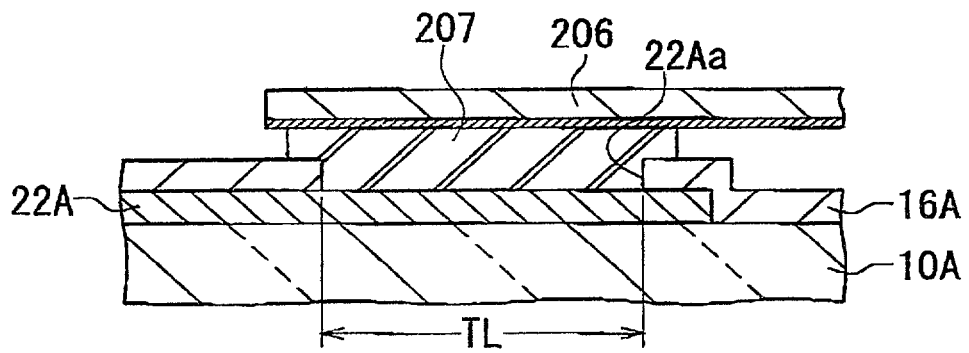
FIG. 9B is a schematic, partial, enlarged cross-sectional view along the line IXB-IXB in FIG. 9A, which shows the connection state before the test.

As shown in FIGS. 9A and 9B, testing terminal units 201 of first to third types, each of which had 2000 dummy scan-line terminals 22A arranged along a straight line at equal intervals, were prepared. The dummy terminals 22A, which were connected to each other in series by way of conductive connection lines 204, had the same TiN/Ti/Al structure as that of the scan-line terminals 22 of the active matrix substrate 1 of the first embodiment. The dummy terminals 22A formed the first type of the units 201 had a nitrogen concentration of 15 atomic %. The dummy terminals 22A formed the second type of the units 201 had a nitrogen concentration of 25 atomic %. The dummy terminals 22A formed the third type of the units 201 had a nitrogen concentration of 35 atomic %.

Dummy Tape carrier packages (TCPs) 206, each of which had 2000 wiring or conductive lines arranged on a dielectric base sheet in the same way as that of the dummy terminals 22A of each unit 201, was prepared. These dummy TCPs 206 were a typical tape-shaped flat cable used for interconnection of the LCD panel and the driver circuit unit thereof. The wiring lines of each TCP 206 were mechanically and electrically connected to the dummy terminals 22A of the corresponding unit 201 with metallic bonding members 207 through their openings 22Aa, as shown in FIG. 9B. The reference symbols 10A and 16A in FIG. 9B denote the glass plate and the gate insulating film, respectively.

Two measuring terminals 202 and 203 were formed on each unit 201 at its either end. The measuring terminal 202 was electrically connected to the terminal 22A by way of the line 204 at the corresponding end (i.e., the left-side end in FIG. 9A) of the unit 201. The measuring terminal 203 was electrically connected to the terminal 22A by way of the line 204 at the corresponding end (i.e., the right-side end in FIG. 9A) of the unit 201. A resistance meter (RM) 205 was electrically connected across the measuring terminals 202 and 203 of each unit 201 in order to measure the electrical resistance of the 2000 dummy terminals 22A and the TCPs 206 connected in series.

The electrical resistance between the measuring terminals 202 and 203 of each unit 201 was measured with the resistance meter 205 at the start of this test. Thereafter, each unit 201 was subjected to a heat treatment Process along with the corresponding dummy TCP 206 under the process condition that the temperature was 85° C., the humidity was 85%, and the heating period was 1000 hours. When the heat treatment process was finished, the electrical resistance between the measuring terminals 202 and 203 was measured again with the resistance meter 205.

Figure 9C:
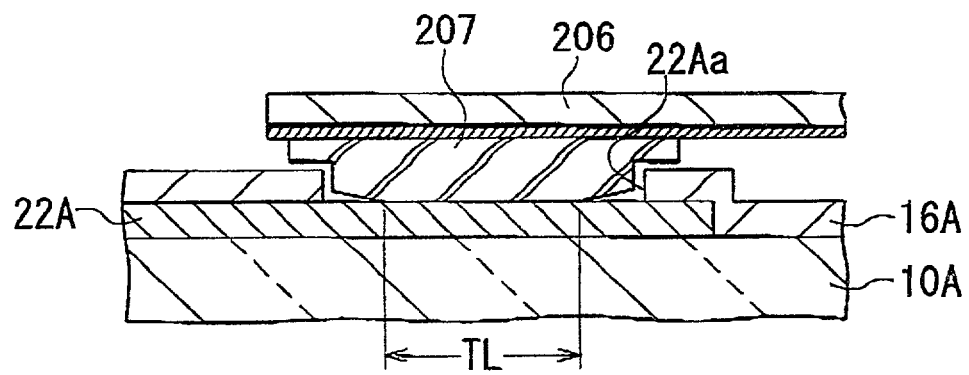
FIG. 9C is a schematic, partial, enlarged cross-sectional view along the line IXB-IXB in FIG. 9A, which shows the connection state after the test.

As shown in FIGS. 9B and 9C, some deformation was caused in the bonding members 207 due to the heat treatment process. Typically, defective connection of the member 207 to the terminal 22A will start at their peripheries. Therefore, when the heat treatment process was finished, the members 207 were turned into the undesired state, as shown in FIG. 9C. As a result, the connection length TL of the members 207 with the terminals 22A decreased from the value shown in FIG. 9B to the value shown in FIG. 9C.

In this test, the acceptable value of the connection length TL was set at 0.1 mm, where the electrical resistance increase was set at "2" (arbitrary unit), as shown in FIG. 8. If the electrical resistance increase thus measured did not exceed the value of "2" after the above-described heat treatment process, the testing terminal unit 201 in question was judged as good or non-defective.

The measured electrical resistance increase of the testing terminal units 201 with three different nitrogen concentrations of 15, 25, and 35 atomic % in this test was plotted in FIG. 8. If the three circular dots are interconnected with a broken, continuous curve, it was found that the threshold value of the nitrogen concentration of the TiN film 103 was 25 atomic %. This means that if the nitrogen concentration of the TiN film 103 is equal to or higher than 25 atomic %, the electrical resistance increase can be limited to the reference value of "2" or lower, including fluctuation or deviation of the measured value. In other words, the electrical resistance increase is suppressed against corrosion and accordingly, the connection reliability at the scan-line terminals 22 is improved.

As explained above, the signal lines 12 and the source and drain electrodes 19 and 20 are formed by the two-level Cr/ITO conductive structure in the first embodiment. However, the signal lines 12 and the source and drain electrodes 19 and 20 may be formed by the three-level TiN/Ti/Al structure used for the gate electrodes 15 and the scan lines 11.

Second Embodiment

FIG. 10 and FIGS. 11A to 11E show the configuration of an active matrix substrate 1A used in an active matrix addressing LCD device according to a second embodiment of the invention. Unlike the first embodiment, this device is of the lateral electric-field type. This device comprises the active matrix substrate 1A and an opposite substrate (not shown) coupled to each other in parallel to form a specific gap between them-with a sealing member (not shown) The gap between the substrates forms a closed space in which a specific liquid crystal is confined. This configuration is the same as the first embodiment.

The same reference numerals or symbols are attached to the same or corresponding elements as those of the first embodiment in FIG. 10 and FIGS. 11A to 11E.

Figure 10:
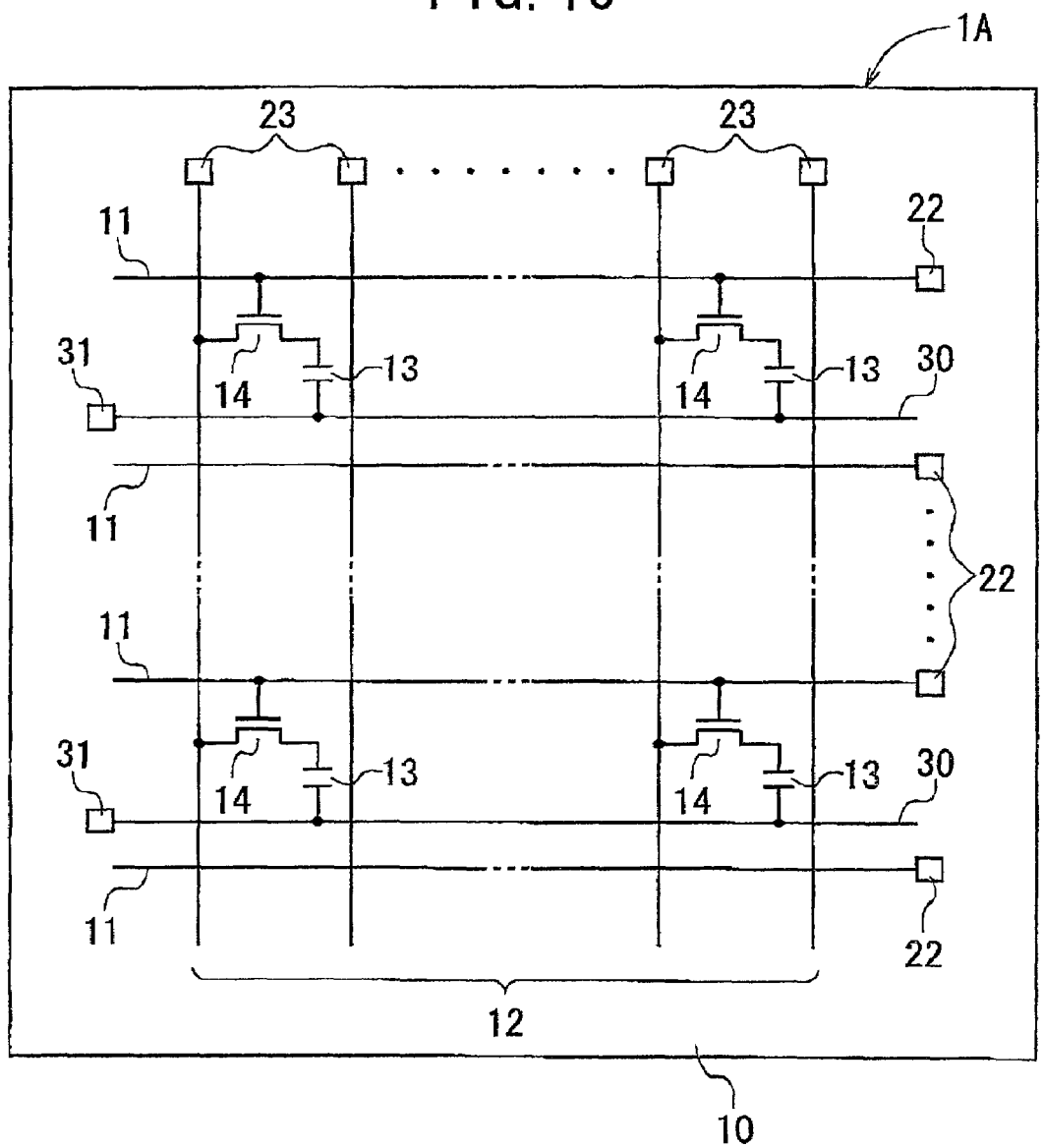
FIG. 10 is a schematic plan view showing the configuration of an active matrix substrate of an active matrix addressing LCD device according to a second embodiment of the invention
Figure 11A:
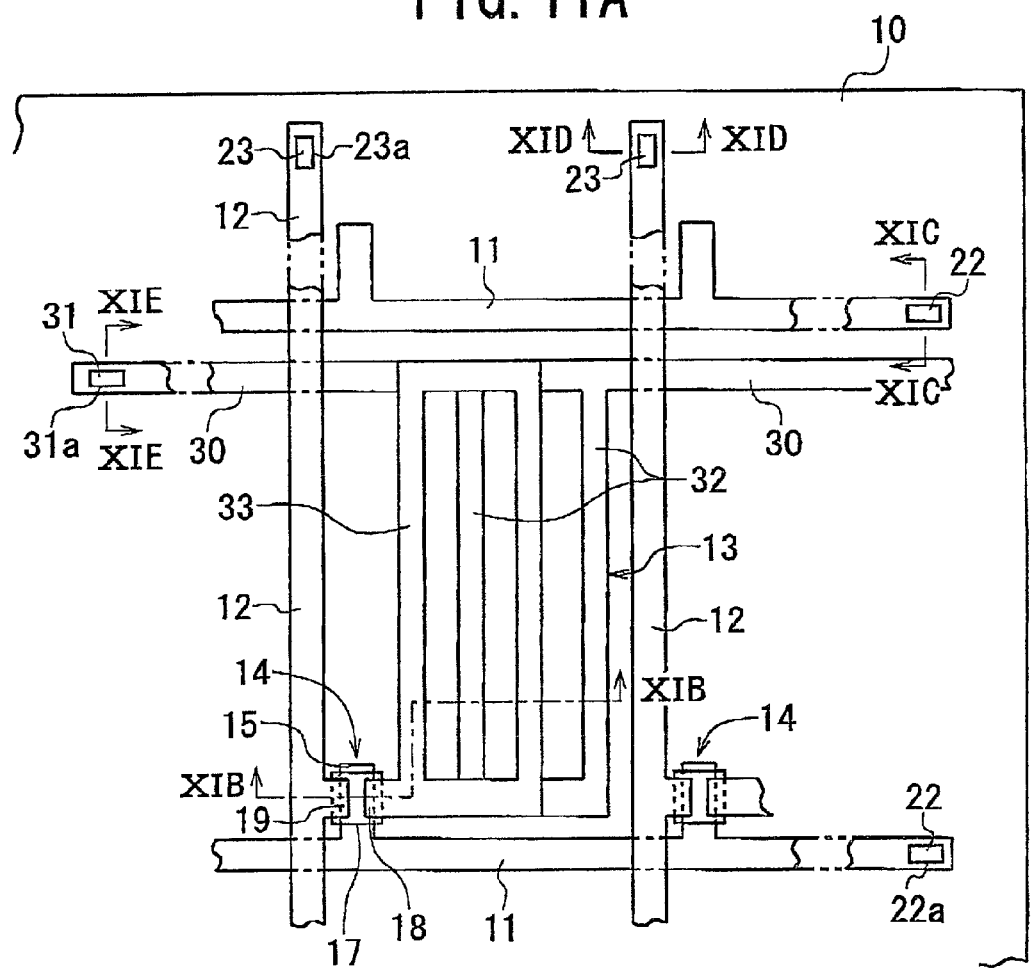
FIG. 11A is a schematic, partial, enlarged plan view showing the layout of the pixel area and its neighborhood of the substrate of the device according to the second embodiment of FIG. 10.

As shown in FIGS. 10 and 11A, the active matrix substrate 1A of the second embodiment comprises a transparent glass plate 10. Scan lines 11 extending in the first direction (in the horizontal direction in FIG. 10) are arranged at equal intervals on the surface of the plate 10 in the second direction (in the vertical direction in FIG. 10) perpendicular to the first direction.

Common lines 30 extending in the first direction are arranged at specific intervals on the surface of the plate 10 in the second direction. The common lines 30 are parallel to the scan lines 11 and arranged between the adjacent scan lines 11.

Signal lines 12 extending in the second direction are arranged at equal intervals on the surface of the plate 10 in the first direction Thus, the scan lines 11 and common lines 30 intersect perpendicularly with the signal lines 12.

Pixel areas 13 are formed in the rectangular areas formed on the surface of the plate 10 by the respective scan, common, and signal lines 11, 30, and 12. Thus, the areas 13 are arranged in a matrix array on the surface of the plate 11.

TFTs 14 are arranged on the surface of the plate 11, which are located in the respective pixel areas 13. The TFTs 14, which are of the inverted-staggered type, are used to control the voltages applied to the corresponding areas 13.

Figure 11B:
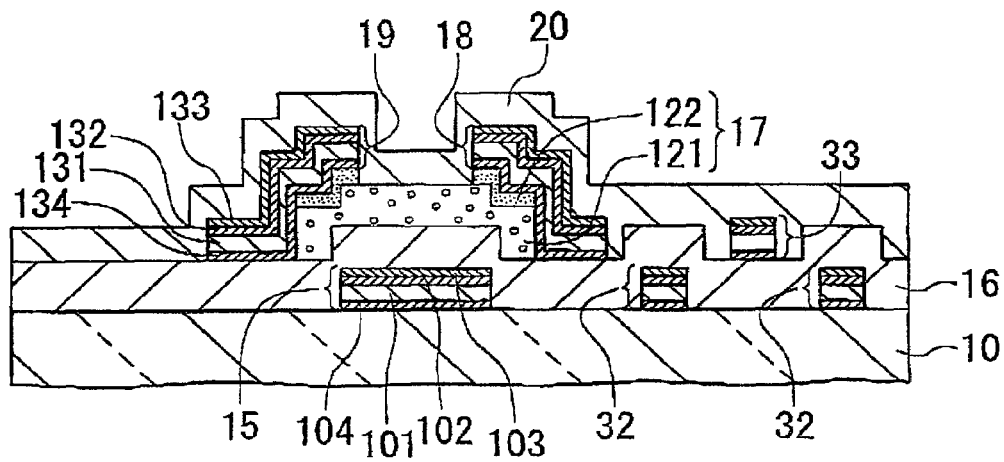
FIG. 11B is a schematic, partial, enlarged cross-sectional view along the line XIB-XIB in FIG. 11A.
Figure 11C:
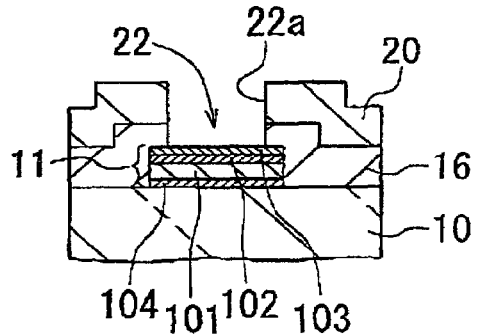
FIG. 11C is a schematic, partial, enlarged cross-sectional view along the line XIC-XIC in FIG. 11A.
Figure 11D:
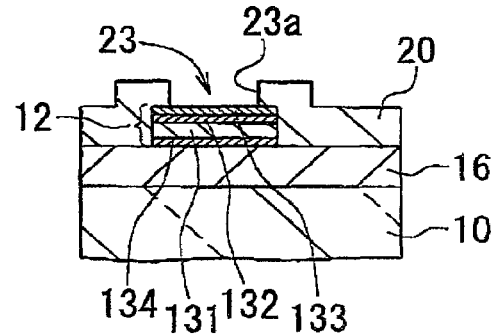
FIG. 11D is a schematic, partial, enlarged cross-sectional view along the line XID-XID in FIG. 11A.
Figure 11E:
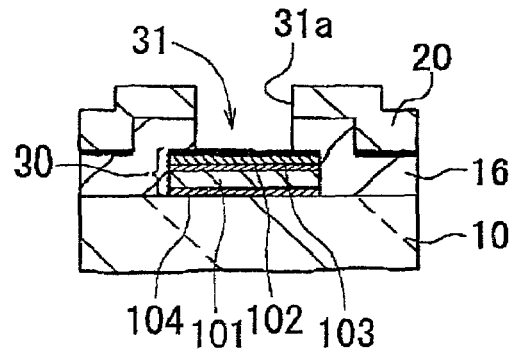
FIG. 11E is a schematic, partial, enlarged cross-sectional view along the line XIE-XIE in FIG. 11A.
Figure 12B:
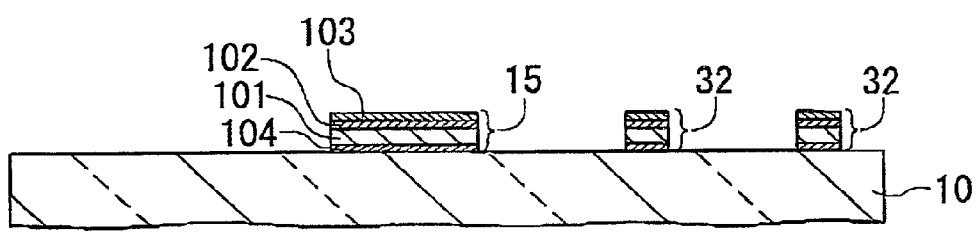
Figure 12C:
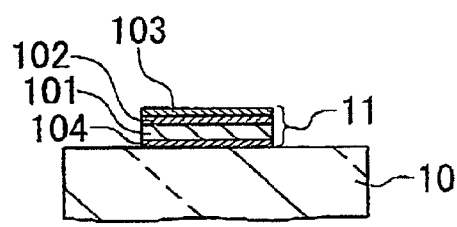
Figure 12D:
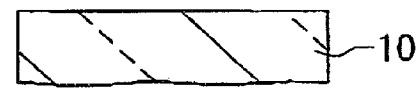
Figure 12E:
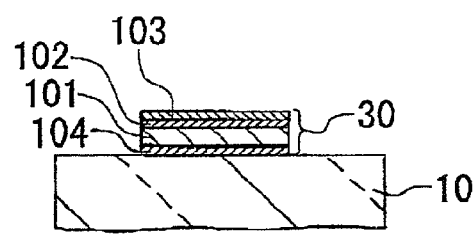
Figure 13B:
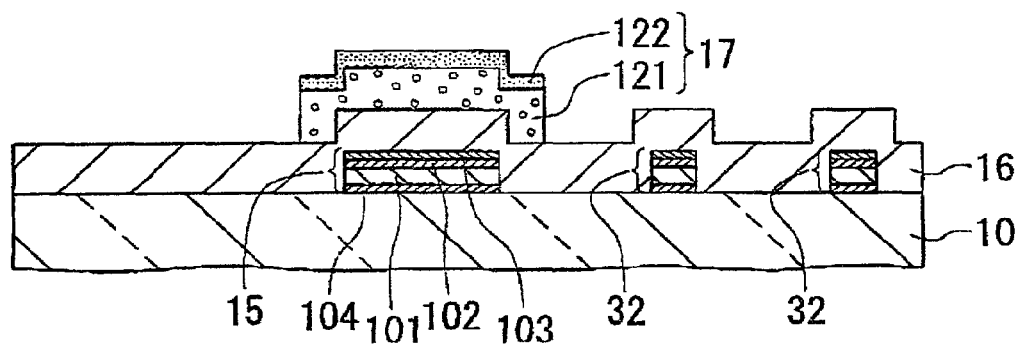
FIGS. 13B to 13E are schematic, partial, enlarged cross-sectional views along the lines XIB-XIB, XIC-XIC, XID-XID, and XIE-XIE in FIG. 11A, respectively, which show the process step of FIG. 13A.
Figure 13C:
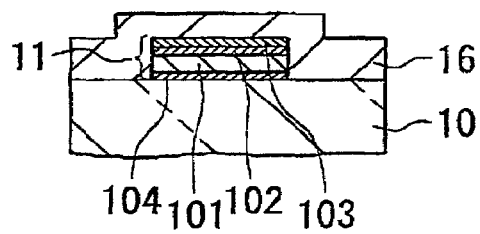
Figure 13D:
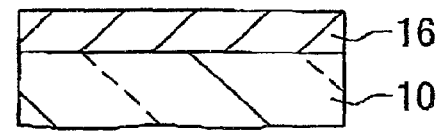
Figure 13E:
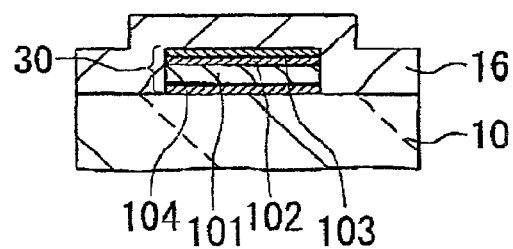
Figure 14A:
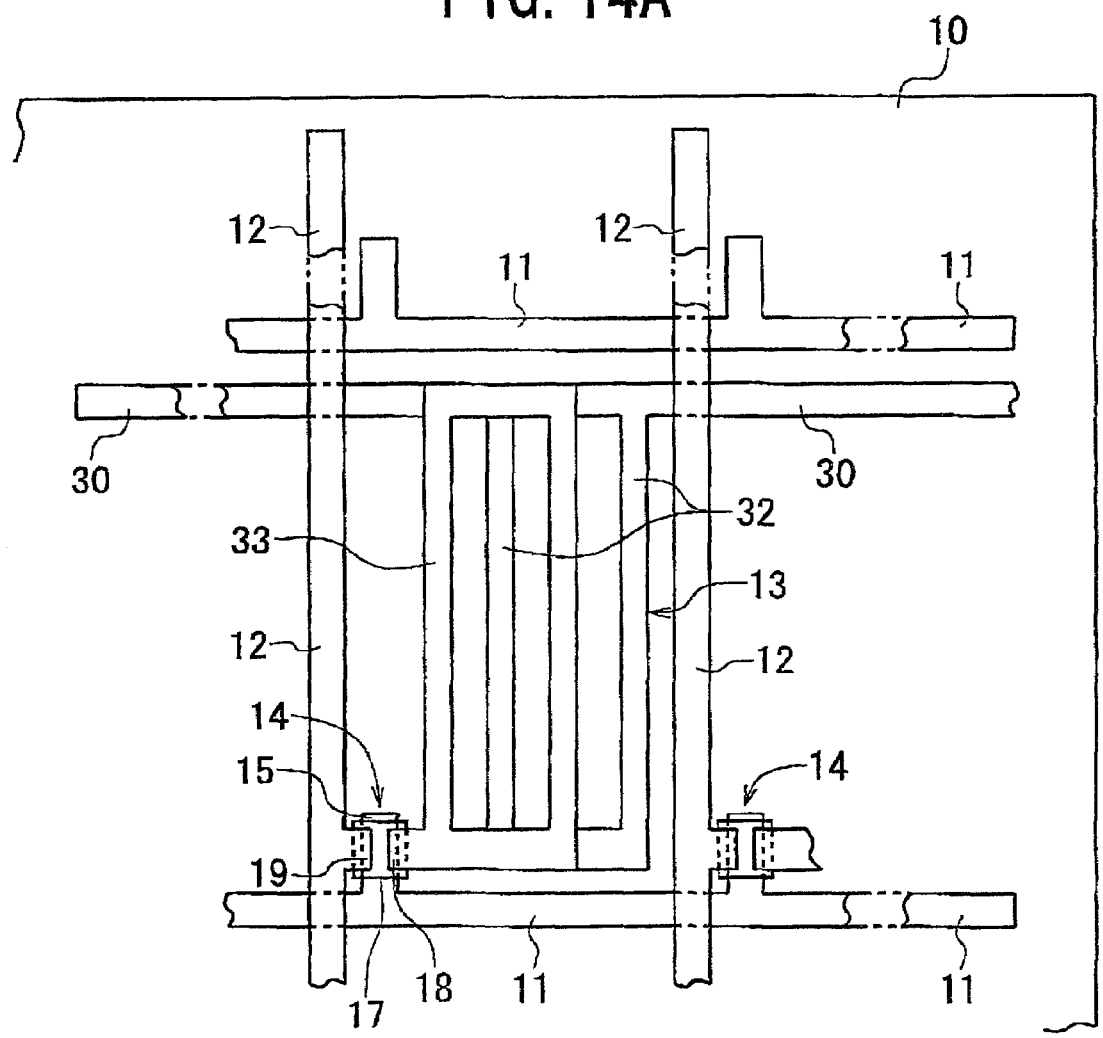
FIG. 14A is a schematic, partial, enlarged plan view showing the process step of the method of fabricating the substrate of the device according to the second embodiment of FIG. 10, which is subsequent to the stem of FIG. 13A.
Figure 14B:
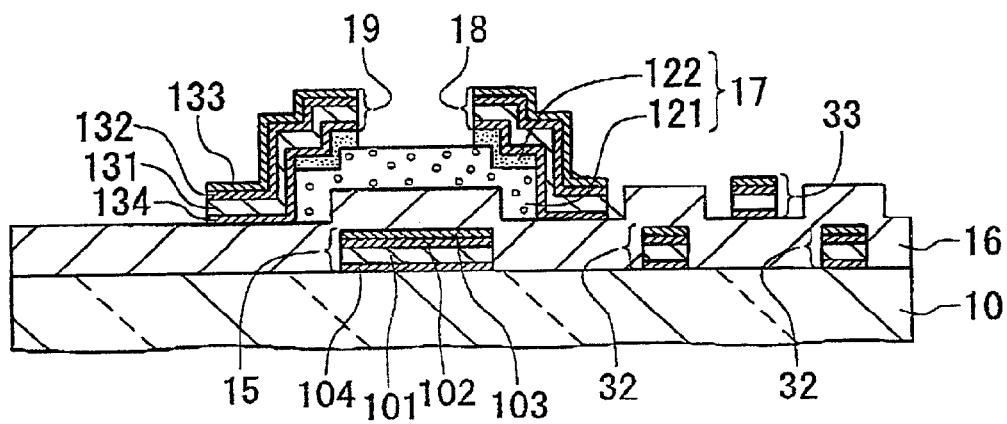
FIGS. 14B to 14E are schematic, partial, enlarged cross-sectional views along the lines XIB-XIB, XIC-XIC, XID-XID, and XIE-XIE in FIG. 11A, respectively, which show the process step of FIG. 14A.
Figure 14C:
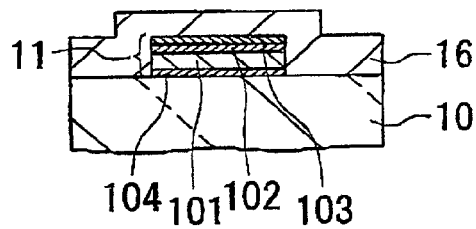
Figure 14D:
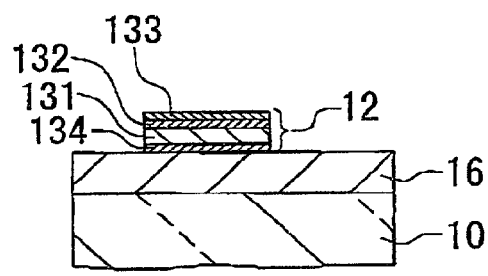
Figure 14E:
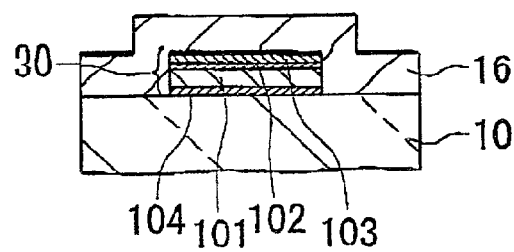
Figure 15A:
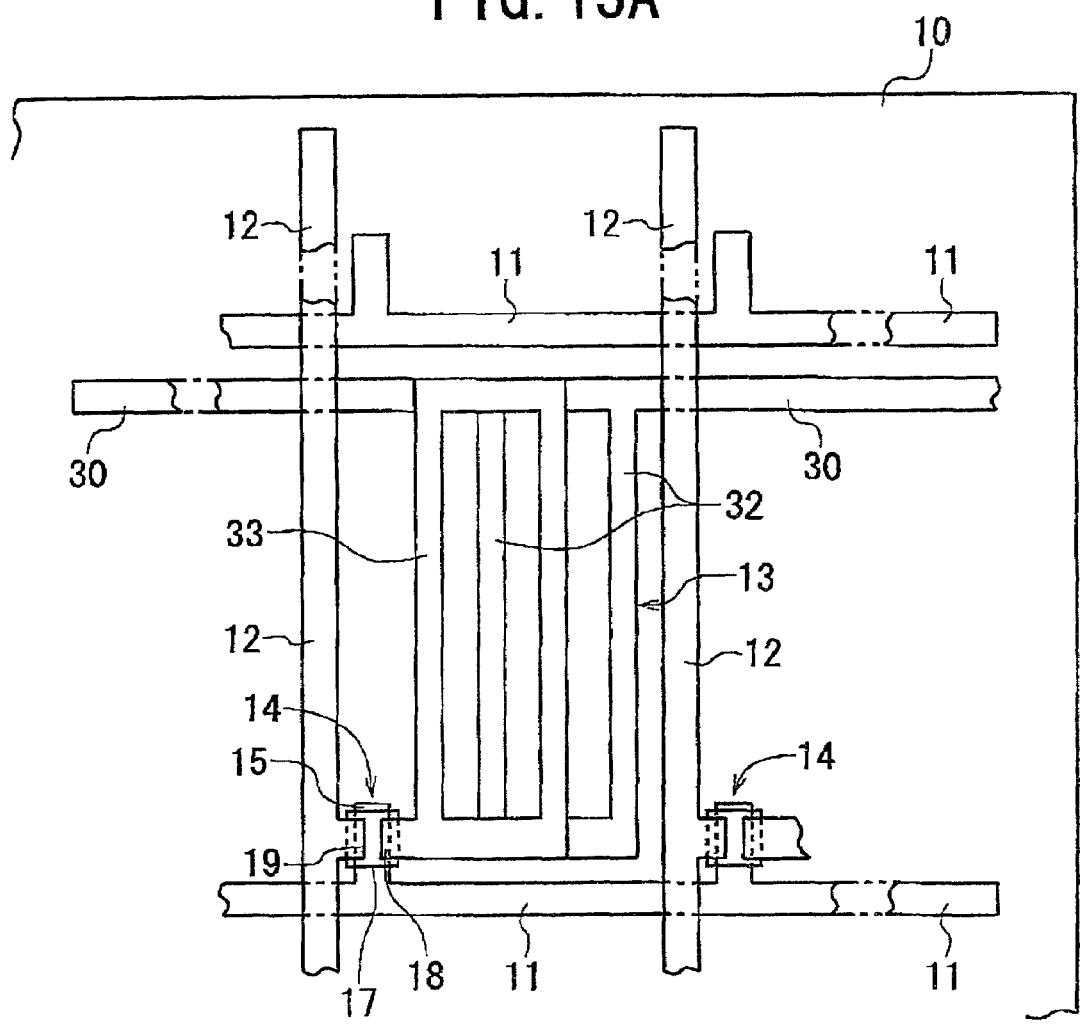
FIG. 15A is a schematic, partial, enlarged plan view showing the process step of the method of fabricating the substrate of the device according to the second embodiment of FIG. 10, which is subsequent to the step of FIG. 14A.
Figure 15B:
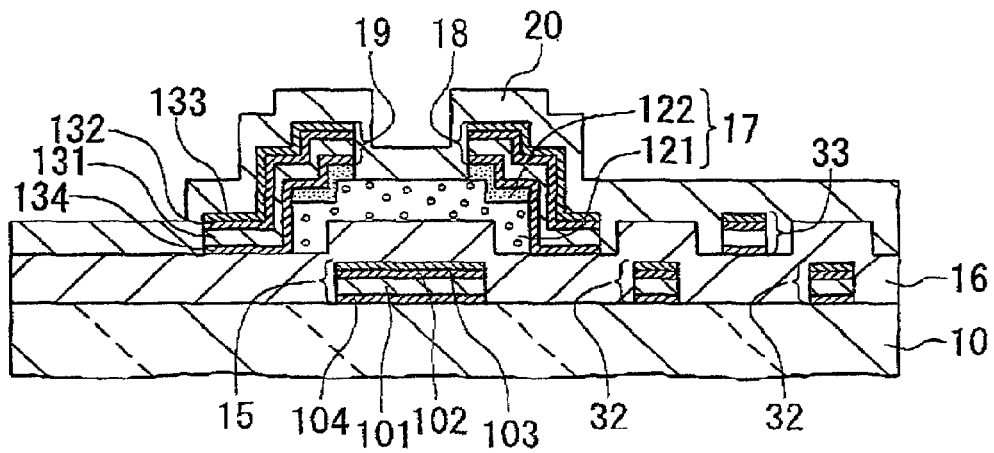
FIGS. 15B to 15E are schematic, partial, enlarged cross-sectional views along the lines XIB-XIB, XIC-XIC, XID-XID, and XIE-XIE in FIG. 11A, respectively, which show the process step of FIG. 15A.
Figure 15C:
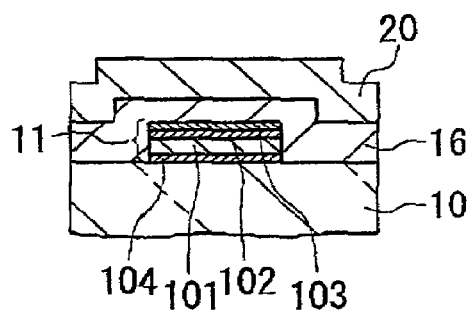
Figure 15D:
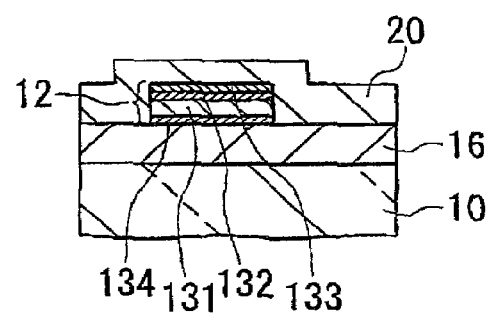
Figure 15E:
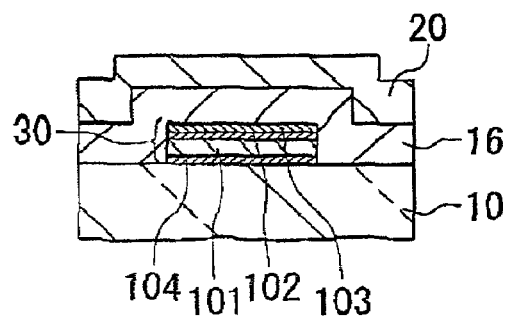

As clearly shown in FIG. 11B, each of the TFTs 14 has a gate electrode 15, a gate insulating film 16, a semiconductor island 17, a source electrode 18, and a drain electrode 19. The gate electrode 15 is located on the same level as the scan and common lines 11 and 30 on the surface of the glass plate 10. The gate insulating film 16 is formed on the surface of the plate 10 to cover the scan and common lines 11 and 30 and the gate electrode 15. The semiconductor island 17 is formed on the gate insulating film 16 to be opposite to the gate electrode 15 by way of the film 16. The source electrode 18 and the drain electrode 19 are formed on the same level as the signal lines 12 on the surface of the plate 10. The source electrode 18 is located on one side of the island 17 and the drain electrode 19 is located on the other side thereof. A passivation film 20 is formed to cover the TFTs 14 over the entire surface of the plate 10.

The gate insulating film 16 and the passivation film 20 are commonly used by all the TFTs 14.

Each of the pixel areas 13 comprises a comb- or frame-shaped common electrode 32 formed in the same level as the gate electrode 13, and a comb- or frame-shaped pixel electrode 33 formed in the same level as the source electrode 18. The level of the source electrode 18 is higher than that of the pixel electrode 33. The pixel electrode 33 is laterally shifted or staggered in the first direction (i.e., in the horizontal direction in FIG. 11A) with respect to the common electrode 32 along the surface of the plate 10, as clearly shown in FIGS. 11A and 11B. The common and pixel electrodes 32 and 33 are made of a transparent conductive material such as ITO.

The gate electrode 15 is connected to a corresponding one of the scan lines 11. The drain electrode 19 is connected to a corresponding one of the signal lines 12. The source electrode 19 is connected to a corresponding one of the pixel electrodes 33. The common electrode 32 is connected to a corresponding one of the common lines 30.

Each of the scan lines 11 has a connection terminal 22 at its end, as shown in FIGS. 10 and 11A. The connection terminal 22 of the line 11 is exposed from the gate insulating film 16 and the passivation film 20 through a corresponding opening 22a, as clearly shown in FIG. 11C. Similarly, each of the signal lines 12 has a connection terminal 23 at its end, as shown in FIGS. 10 and 11A. The connection terminal 23 of the line 12 is exposed from the gate insulating film 16 and the passivation film 20 through a corresponding opening 23a, as clearly shown in FIG. 11D. Each of the common lines 30 has a connection terminal 31 at its end, as shown in FIGS. 10 and 11A. The connection terminal 31 of the line 30 is exposed from the gate insulating film 16 and the passivation film 20 through a corresponding opening 32a, as clearly shown in FIG. 11E.

The gate electrodes 15, the scan lines 11, the common electrodes 32, and the common lines 30 are formed by the same multilevel conductive film. In other words, they are formed by a common conductive film with a multilevel structure. Specifically, as seen from FIGS. 11B and 11C, the common conductive film is formed by a Ti film (thickness: 50 nm) 104 located at the bottom, an Al film (thickness: 200 nm) 101 located at the lower middle, a Ti film (thickness: 50 nm) 102 located at the upper middle, and a TiN film (thickness: 50 nm) 103 located at the top. Therefore, it is said that the common conductive film has the four-level TiN/Ti/Al/Ti structure.

The drain electrodes 19, the signal lines 12, the source electrodes 18, and the pixel electrodes 33 are formed by the same multilevel conductive film. In other words, they are formed by a common conductive film with a multilevel structure. Specifically, as seen from FIGS. 11B and 11D, the common conductive film is formed by a Ti film (thickness: 50 nm) 134 located at the bottom, an Al film (thickness: 200 nm) 131 located at the lower middle, a Ti film (thickness: 50 nm) 132 located at the upper middle, and a TiN film (thickness: 50 nm) 133 located at the top. This configuration is the same as that of the common conductive film for the gate electrodes 15, the scan lines 11, the common electrodes 32, and the common lines 30. Therefore, it is said that the common conductive film for the drain electrodes 19, the signal lines 12, the source electrodes 18, and the pixel electrodes 33 has the four-level TiN/Ti/Al/Ti structure as well. This point is unlike the first embodiment.

Next, a method of fabricating the active matrix substrate 1A of the second embodiment is explained below with reference to FIGS. 12A to 12E, 13A to 13E, 14A to 14E, and 15A to 15E.

First, as shown in FIGS. 12A to 12E, the Ti film 104 with a thickness of 50 nm, the Al film 101 with a thickness of 200 nm, the Ti film 102 with a thickness of 50 nm, and the TiN film 103 with a thickness of 50 nm are successively formed on the surface of the glass plate 10 by a sputtering method. Thus, the four-level TiN/Ti/Al/Ti structure is formed.

Then, the first photolithography process is carried out for the four-level TiN/Ti/Al/Ti structure thus formed, forming a patterned first photoresist film. Using the patterned first photoresist film as a mask, the TiN/Ti/Al/Ti structure is patterned by a dry etching method, thereby forming the gate electrodes 15, the scan lines 11 connected to the gate electrodes 15, the common electrodes 32, and the common lines 30 connected to the common electrodes 32 an the surface of the plate 10. The state at this stage is shown in FIGS. 12A to 12E.

Like the first embodiment, the TiN film 103 is formed by a reactive sputtering method in such a way that the nitrogen concentration of the film 103 is 25 atomic % or higher while controlling the flow rate ratio of Ar and $N_2$ gases. This is easily realized under the same condition as shown in the first embodiment Thereafter, as shown in FIGS. 13A to 13E, a SiN film with a thickness of 400 nm is formed on the whole surface of the plate 10 as the gate insulating film 16. The SiN film 16 covers entirely the patterned TiN/Ti/Al/Ti structure. An i-type a-Si film 121 with a thickness of 250 nm is formed on the SiN film 16 and then, an $n^+$-type a-Si film 122 with a thickness of 50 nm is formed on the i-type a-Si film 121. The film 122 is doped with phosphorus (P) as a n-type dopant. The $n^+$-type a-Si film 122 is to ensure ohmic contact with the drain and source electrodes 18 and 19. These two films 121 and 122 are formed by a plasma-enhanced CVD method.

Next, the second photolithography process is carried out to form a patterned second photoresist film. Using the patterned second photoresist film as a mask, the a-Si films 121 and 122 are successively patterned by a dry etching method, thereby forming the semiconductor islands 17 on the gate insulating film (i.e., the SiN film) 16 to be opposite to the corresponding gate electrodes 15. The state at this stage is shown in FIGS. 13A to 13E.

The Ti film 134 with a thickness of 50 nm, the Al film 131 with a thickness of 200 nm, the Ti film 132 with a thickness of 50 nm, and the Ti film 133 with a thickness of 50 nm are successively formed on the $n^+$-type a-Si film 122 over the whole surface of the glass plate 10 by a sputtering method. Thus, the TiN/Ti/Al/Ti structure is formed to have the same height as that of the above-described TiN/Ti/Al/Ti structure for the gate electrodes 15, the scan lines 11, the common electrodes 32, and the common lines 30.

Next, the third photolithography process is carried out to form a patterned third photoresist film. Using the patterned third photoresist film as a mask, the TiN/Ti/Al/Ti structure is patterned by a wet etching method. Thus, the drain electrodes 19, the signal lines 12 united with the corresponding drain electrodes 19, the source electrodes 18, and the pixel electrodes 33 united with the corresponding source electrodes 18 are formed.

Like the above-described step of forming the TiN film 103, the TiN film 133 is formed by a reactive sputtering method in such a way that the nitrogen concentration of the film 133 is 25 atomic % or higher while controlling the flow rate ratio of Ar and $N_2$ gases. This is easily realized under the same condition as shown in the first embodiment.

Using the source and drain electrodes 18 and 19 as a mask, the $n^+$-type a-Si film 122 is selectively removed by a dry etching method. Thus, "channel gaps" are formed between the corresponding pairs of the electrodes 18 and 19. The remaining film 122 forms the ohmic layers located just below the electrodes 18 and 19. As a result, the TFTs 14 are formed to be arranged in a matrix array on the plate 10. The state at this stage is shown in FIGS. 14A to 14E.

Subsequently, a SiN film, which serves as the passivation film 20, is formed to cover the TFTs 14, the scan, common, and signal lines 11, 30, and 12, and the pixel areas 13 over the entire surface of the plate 10 by a plasma-enhanced CVD method, Then, the fourth photolithography process is carried out to form a patterned fourth photoresist film. Thereafter, using the patterned fourth photoresist film as a mask, the SiN film 20 and the gate insulating film 16 are patterned by an etching method. The SiN or passivation film 20 and the gate insulating film 16 are selectively removed at the terminals 22 of the scan lines 11 and the terminals 31 of the common lines 30. The SiN film 20 is selectively removed at the terminals 23 of the signal lines 12. Thus, the windows or openings 22a, 23a, and 31a are formed at the terminals 22, 23, and 31, respectively.

As a result, as shown in FIGS. 11A to 11E, the scan lines 11 are exposed from the passivation film 20 and the gate insulating film 16 by way of the openings 22a at the scan-line terminals 22. The signal lines 12 are exposed from the passivation film 20 by way of the openings 23a at the signal-line terminals 23. The common lines 30 are exposed from the passivation film 20 and the gate insulating film 16 by way of the openings 31a at the common-line terminals 31.

Furthermore, although not illustrated here, an alignment layer is formed on the passivation film 20. Thus, the active matrix substrate 1A according to the second embodiment is completed.

On the other hand, an opposite substrate (not shown) is placed to be opposed to the active matrix substrate 1 at a specific gap and then, these two substrates are coupled together with a sealing member so as to confine a liquid crystal in the gap. Thus, the LCD panel is completed.

Thereafter, one end of a flat cable of a driver circuit unit is connected to the respective scan, common, and signal lines 11, 30, and 12 at their terminals 22, 31, and 23. Thus, the conductive lines combined in the cable are connected to the scan, common, and signal lines 11, 30, and 12, resulting in electrical interconnection of the driver circuit unit with the lines 11, 30, and 12 in the LCD device. This makes it possible to supply electric power to the LCD panel and to drive the pixels on the active matrix substrate 1A, thereby displaying images on the screen of the device. In this way, the active matrix addressing LCD device of the second embodiment is finally fabricated.

With the LCD device according to the second embodiment, the active matrix substrate 1A employs the four-level TiN/Ti/Al/Ti structure to form the gate electrodes 15, and the scan, common, and signal lines 11, 30, and 12 and therefore, the effect to suppress Al hillocks is enhanced or raised without complicating the structure of the lines 11, compared with the prior-art TiN/Al structure of the of the Publication No. 7-120789. This is the same as the first embodiment.

Moreover, since the Ti film 104 or 134 is additionally formed below the Al film 101 or 131, there is an additional advantage that the crystallinity of the Al film 101 or 131 is improved, thereby suppressing the migration phenomenon. This enhances the effect of the TiN/Ti/Al structure to suppress the Al hillock.

The inventors conducted the same test for measuring the electrical connection resistance as shown in the first embodiment with respect to the scan-line terminals 22, the common-line terminals 31, and the signal-line terminals 23. As a result, the same result to represent the improvement of connection reliability as shown in FIG. 8 was obtained if the TiN film 103 or 133 has a nitrogen concentration of 25 atomic % or higher.

It was found from the same test as above that substantially no change was observed about the effect to suppress the Al hillock even if the thickness of the TiN film was changed.

Third Embodiment

Although not illustrated here, an active matrix substrate used in an active matrix addressing LCD device according to a third embodiment has a three-level TiN/Al/Ti structure. Examples of the thickness of these Ti, Al, and TiN films are shown by the sample Nos. 5 and 6 in FIG. 7. The other configuration of the active matrix substrate of the third embodiment is the same as the substrate 1 of the first embodiment.

As seen from FIG. 7, the substrate of the third embodiment has an additional advantage that the number of Al hillocks can be made substantially zero, in other words, Al hillocks can be prevented approximately completely.

Variations

Needless to say, the invention is not limited to the above-described first to third embodiments. Any change or modification may be added to these embodiments within the spirit of the invention. For example, although a substantially pure Al film is used in the first to third embodiments, the invention is not limited to this. Any Al alloy film may be used instead of a substantially pure Al film to get the advantages of the invention.

While the preferred forms of the present invention has been described, it is to be understood that modifications will be apparent to those skilled in the art without departing from the spirit of the invention. The scope of the present invention, therefore, is to be determined solely by the following claims.

What is claimed is:

1. An active matrix addressing LCD device comprising: an active matrix substrate having a transparent, dielectric plate, thin film transistors (TFTs) arranged on the plate, and pixel electrodes arranged on the plate; wherein the active matrix substrate includes at least one of scan lines, signal lines, and common lines; a multilevel conductive structure at a terminal of said line; wherein the multilevel conductive structure comprises a TiN film having a nitrogen concentration of 25 atomic % or higher, the TiN film being located at a top of the multilevel conductive structure; and wherein a transparent conductive film is absent from the TiN film so that the TiN film is exposed at said terminal.

2. The device according to claim 1, wherein the multilevel conductive structure comprises an Al-based film located below the TiN film, and at least one Ti film located at least at one of an upper position and a lower position with respect to the Al-based film.

3. The device according to claim 2, wherein each of the lines has a same multilevel conductive structure not only at the respective terminal, but also in the remaining parts thereof.

4. The device according to claim 2, wherein the multilevel conductive structure is a three-level structure formed by the TiN film located at the top, the Ti film located at the middle, and the Al-based film located at the bottom.

5. The device according to claim 2, wherein the multilevel conductive structure is a three-level structure formed by the TiN film located at the top, the Al-based film located at the middle, and the Ti film located at the bottom.

6. The device according to claim 2, wherein the multilevel conductive structure is a four-level structure formed by the TiN film located at the top, the Ti film located at the upper middle, the Al-based film located at the lower middle, and the Ti film located at the bottom.

7. The device according to claim 2, wherein the Al-based film is made of Al, or an Al alloy including Al as its main ingredient.

* * * * *